(12) United States Patent
Bugg et al.

(10) Patent No.: US 11,002,662 B2
(45) Date of Patent: May 11, 2021

(54) BOND TEST APPARATUS AND METHOD

(71) Applicant: NORDSON CORPORATION, Westlake, OH (US)

(72) Inventors: Martin Bugg, Aylesbury (GB); Robert Deards, Aylesbury (GB)

(73) Assignee: Nordson Corporation, Westlake, OH (US)

(*) Notice: Subject to any disclaimer, the term of this patent is extended or adjusted under 35 U.S.C. 154(b) by 362 days.

(21) Appl. No.: 16/041,549

(22) Filed: Jul. 20, 2018

(65) Prior Publication Data

US 2019/0056307 A1 Feb. 21, 2019

(30) Foreign Application Priority Data

Aug. 16, 2017 (GB) ....................................... 1713169
Jun. 8, 2018 (EP) ....................................... 18176878

(51) Int. Cl.
*G01N 19/04* (2006.01)
*G01N 3/06* (2006.01)
(Continued)

(52) U.S. Cl.
CPC ............ *G01N 19/04* (2013.01); *G01L 5/0033* (2013.01); *G01N 3/068* (2013.01); *G01N 3/08* (2013.01); *G01N 3/24* (2013.01); *G01R 31/2886* (2013.01); *H05K 13/00* (2013.01); *G01N 2203/0286* (2013.01); *G01N 2203/0296* (2013.01);
(Continued)

(58) Field of Classification Search
None
See application file for complete search history.

(56) References Cited

U.S. PATENT DOCUMENTS

| | | | | |
|---|---|---|---|---|
| 4,453,414 A | * | 6/1984 | Ronemus | ............... G01N 19/04 73/827 |
| 6,078,387 A | | 6/2000 | Sykes | |

(Continued)

FOREIGN PATENT DOCUMENTS

| | | |
|---|---|---|
| DE | 19716461 A1 | 10/1998 |
| EP | 2386845 A1 | 11/2011 |

(Continued)

OTHER PUBLICATIONS

European search report dated Dec. 20, 2018 for EP Application No. 18176878.

(Continued)

*Primary Examiner* — Daniel S Larkin
(74) *Attorney, Agent, or Firm* — BakerHostetler

(57) ABSTRACT

A bond test apparatus comprises a test tool assembly 200 comprising a test tool 40 configured to contact a bond during a bond test, a flexure 80 coupled to the test tool assembly, and a sensor. The sensor is configured to provide a measurement of a displacement of a first end of the flexure 80 relative to a second end of the flexure on application of a force to the flexure, and a processor is configured to receive a displacement signal from the sensor and, based on the displacement signal and optionally a known stiffness of the flexure, to determine the force on the flexure. A cartridge for a bond test apparatus, a method of measuring a force in a bond test apparatus, and a method of measuring the closing force on the jaws of a bond test tool are also provided.

31 Claims, 17 Drawing Sheets

(51) Int. Cl.
*H05K 13/00* (2006.01)
*G01L 5/00* (2006.01)
*G01R 31/28* (2006.01)
*G01N 3/08* (2006.01)
*G01N 3/24* (2006.01)

(52) U.S. Cl.
CPC ............. *G01N 2203/0635* (2013.01); *G01N 2203/0641* (2013.01); *G01N 2203/0676* (2013.01); *G01R 31/2896* (2013.01)

(56) References Cited

U.S. PATENT DOCUMENTS

| | | |
|---|---|---|
| 6,301,971 B1 | 10/2001 | Sykes |
| 6,310,971 B1 | 10/2001 | Shiiyama |
| 8,424,390 B2 * | 4/2013 | Lilley .................... G01N 19/04 73/841 |
| 9,170,189 B2 | 10/2015 | Lilley et al. |
| 9,689,934 B2 | 6/2017 | Khamesee et al. |
| 9,708,135 B2 | 7/2017 | Xu |
| 2002/0170360 A1 | 11/2002 | Anand et al. |
| 2008/0190212 A1 * | 8/2008 | Sykes .................... G01N 3/24 73/841 |
| 2009/0019941 A1 | 1/2009 | Sykes et al. |
| 2009/0301216 A1 * | 12/2009 | Sykes .................... G01N 3/04 73/833 |
| 2010/0218615 A1 * | 9/2010 | Sykes .................... G01N 19/04 73/827 |
| 2011/0214510 A1 * | 9/2011 | Lilley .................... G01N 3/24 73/841 |
| 2011/0277556 A1 | 11/2011 | Peecock et al. |
| 2012/0204654 A1 * | 8/2012 | Sykes .................... G01N 3/00 73/826 |
| 2018/0364151 A1 | 12/2018 | Sykes |
| 2019/0331573 A1 * | 10/2019 | Earthman ............... A61B 9/00 |

FOREIGN PATENT DOCUMENTS

| | | |
|---|---|---|
| GB | 1185024 A | 3/1970 |
| KR | 10-0827745 B | 4/2008 |
| WO | 2007/104929 A1 | 9/2007 |
| WO | 2017/099590 A1 | 6/2017 |

OTHER PUBLICATIONS

4000Plus Bondtester: Engineered for Excellence; Nordson DAGE; Jul. 6, 2013; 8 pages, Jul. 6, 2013.

* cited by examiner

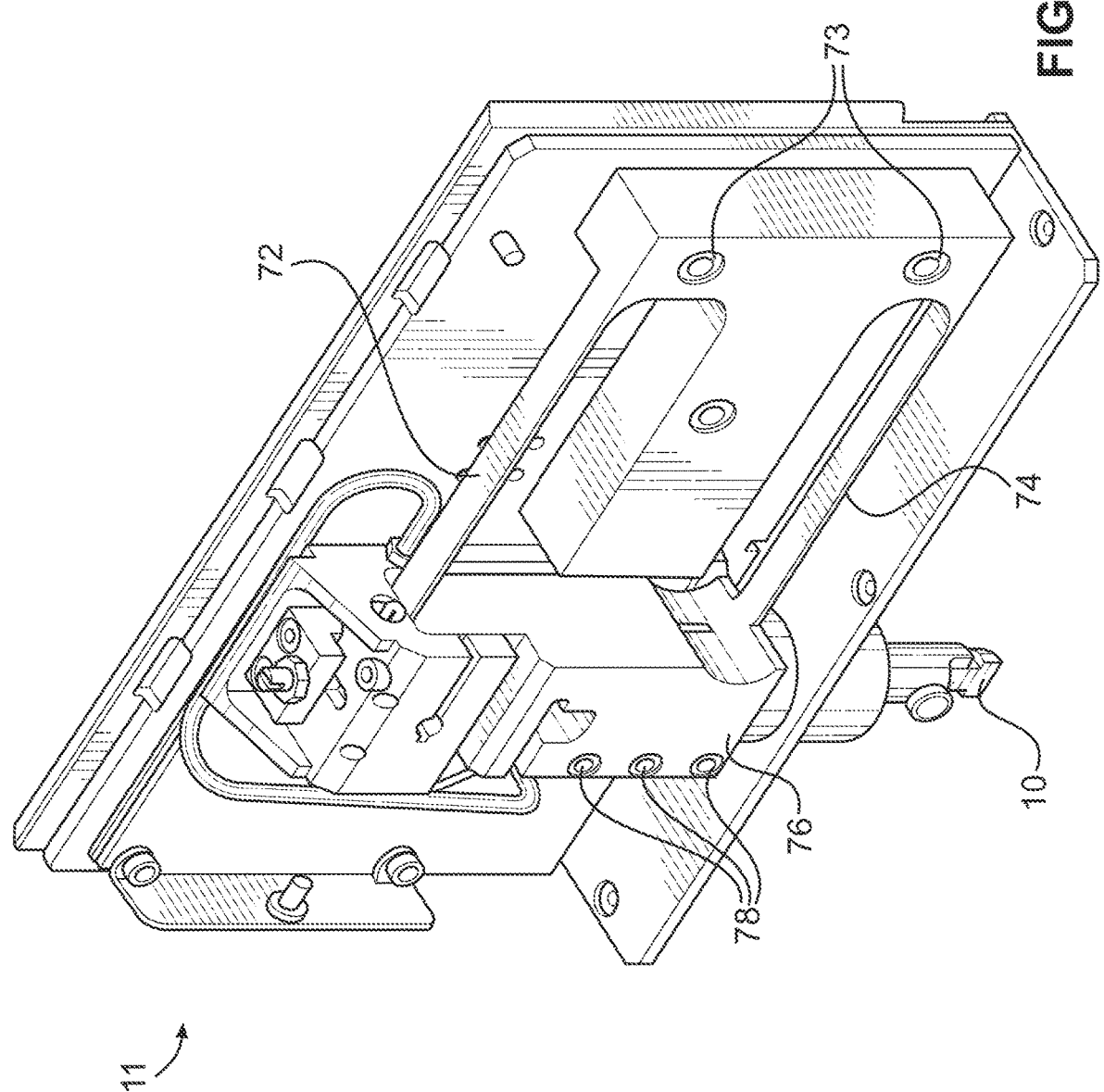

BOND TEST APPARATUS AND METHOD

CROSS REFERENCE TO RELATED APPLICATIONS

This application claims priority to European Patent App. No. 18176878, filed Jun. 8, 2018, which claims priority to Great Britain patent app. no. 1713169.9, filed Aug. 16, 2017, the disclosures of which are hereby incorporated by reference herein.

FIELD OF THE INVENTION

The present invention relates to a bond test apparatus for testing the strength of bonds on electrical circuitry, such as a PCB or semiconductor device. In particular, the invention relates to an apparatus for measuring the force on a test tool during a bond test. Particularly preferably the invention relates to an apparatus for measuring the closing force on the jaws of a test tool during a bond test.

BACKGROUND TO THE INVENTION

Semiconductor devices are very small, typically from 5 mm×5 mm square to 50 mm×50 mm square, and typically comprise numerous sites for the bonding of electrical conductors to a semiconductor substrate. Each bond consists of a solder or gold ball deposit, known as a "bump", a copper pillar, or a wire adhered to the substrate.

It is necessary to test the bond strength of the bonds, in order to be confident that a particular bonding method is adequate. Because of the very small size of the bonds, tools used to test the bond strength of these bonds must be able to measure very small forces and deflections accurately.

There are several different types of bond tests that are used to test bond strength. For example, shear testing tests the shear strength of a bond by applying a shear force to the side of the bond and shearing the bond off the substrate. Pull testing tests the pull strength of the bond by pulling a ball deposit, or a wire embedded in a ball deposit, away from the substrate. In a push test, a force, or load, is applied in the vertical plane directly downward onto a bond.

Machines that perform these tests typically comprise a bond test tool, be it a shear test tool, push test tool or a pull test tool, that can be positioned relative to the bond under test and then either the bond or the tool is moved in order to perform the test by measuring the force needed to break the bond.

In many cases, the force applied between the test tool and the bond during a bond test is measured directly using strain gauges. For example, a pull tool may be mounted on one or more horizontal beams, or flexures, such that the application of a vertical pull force between the test tool and the bond causes the flexure to bend. By mounting a strain gauge on the flexure, the force on the test tool can be measured. However mounting strain gauges onto flexures is a difficult and expensive process.

Certain types of bond test, such as the Cold Bump Pull (CBP) test, use a test tool comprising tweezer-like jaws to close around and grip a bond before applying a vertical pull force. In such a test, it would be desirable to measure and control the closing force on the test tool jaws, in order to ensure the consistency of the closing/gripping force applied to the bond in each test, and also to assess the strength of the bond material.

Existing methods of closing test tool jaws include using a pneumatic actuator to move a collet along the test tool, so as to exert a closing force and close the jaws. The air pressure on the collet can be varied to vary the closing force applied to the jaws, but this method does not provide a high degree of control to the user. This method also allows very little control over jaw separation, so that the jaws are either fully open or fully closed, and does not provide any feedback information on the force being applied to the bond by the test tool jaws.

Another known method of closing test tool jaws is employed by the XYZTEC® Condor Sigma Series of bond testers, which use an electric motor to drive a pair of gripping jaws, arranged on either side of the test tool, to apply a closing force to the test tool jaws. The XYZTEC bond tester purports to control the closing force on the test tool by regulating the current flow through the motor, while the force applied is measured directly using strain gauges on the gripping jaws. This arrangement is both complex and expensive.

The present invention seeks to overcome these deficiencies in the prior art, and to provide an improved bond test apparatus and an improved method of measuring a force in a bond test apparatus.

SUMMARY OF THE INVENTION

The present invention is defined in the appended independent claims to which reference should now be made. Preferred or advantageous features of the invention are defined in the dependent claims.

Bond Test Apparatus

In a first aspect, the invention may comprise a bond test apparatus comprising a test tool assembly, the test tool assembly comprising a test tool configured to contact a bond during a bond test. The bond test apparatus additionally comprises a flexure coupled to the test tool assembly, and a sensor. The sensor is configured to provide a measurement of a displacement of a first end of the flexure relative to a second end of the flexure on application of a force to the flexure, and the apparatus comprises a processor configured to receive a displacement signal from the sensor and to determine the force on the flexure using the displacement signal. The processor may be configured to use the displacement signal together with a known stiffness of the flexure to determine the force on the flexure.

If the stiffness of the flexure is known, the measurement of displacement may advantageously be used to calculate the magnitude of the force on the flexure. This is particularly useful for measurement of forces during a bond test.

Sensor

The sensor is preferably a displacement sensor, or a distance sensor, that is configured to provide a measurement of the distance by which the first end of the flexure is displaced relative to the second end of the flexure. The sensor may be any sensor which provides an output that varies, ideally proportionally, with the displacement of the first end of the flexure relative to the second end of the flexure.

The sensor advantageously does not directly measure a force applied to the flexure, or to the sensor itself. Thus, the sensor is not a strain gauge. Unlike a strain gauge, the sensor is configured to provide a measure of displacement, and is not configured to measure force directly.

Preferably, the sensor is not deformable in response to the application of a force to the flexure. Particularly preferably, the sensor is not bonded to the flexure itself. Preferably, the sensor may be moveable relative to the first or second end of the flexure, and fixed relative to the other end of the flexure.

Sensors which provide a measurement of displacement rather than a direct measurement of force, and which preferably are not deformed by application of a force to the flexure, may advantageously exhibit very little creep. These sensors may therefore maintain better accuracy than the piezoelectric or piezo resistive strain gauges conventionally used to measure force in bond testing. As strain gauges attached to flexures must inherently be deformed, or strained, on bending of the flexure, they may fail to recover completely following severe bending, such that strain gauges typically exhibit creep over time, making their outputs less accurate. Further, if a strain gauge is to measure the force on a flexure it must be attached to the flexure itself, for example by an adhesive bond. Such an adhesive bond may be deformed during deformation of the strain gauge, and may introduce a significant source of measurement creep.

The sensors used in the present invention preferably do not directly experience the force applied to the flexure during bond testing, as the force is applied to the flexure, and not to the sensor itself. This increases the lifetime of the sensor, and reduces the likelihood of creep in the sensor. Further, if the sensor is not bonded to the flexure itself, then there is no need for an adhesive bond which could introduce another source of measurement creep.

The sensor is preferably configured to give an output signal proportional to the displacement of the first end of the flexure relative to the second end of the flexure. Preferably, the sensor is configured to give an output signal which is directly proportional to the displacement of the flexure.

The bond test apparatus comprises a processor, or a controller, configured to receive a signal, or a displacement signal, from the sensor and, based on the signal and a known stiffness of the flexure, to determine the force on the flexure. The processor may advantageously be programmed to control the apparatus based on the calculated force on the flexure, such that the sensor provides feedback to the processor, based on which the processor controls the apparatus.

Prior to use, the stiffness of the flexure may be found by a calibration procedure in which the flexure is loaded with a known force, and the displacement of the first end of the flexure relative to the second end of the flexure is measured.

As strain gauges are themselves deformed by the force applied to the flexure, and thus provide a direct measurement of the applied force, apparatuses using strain gauges do not convert a measurement of displacement into a force based on the stiffness of a flexure. Thus, apparatuses which measure the force on a flexure using a strain gauge do not comprise a processor configured to receive a displacement signal from the sensor and, based on the displacement signal and a known stiffness of the flexure, to determine the force on the flexure.

Preferably, the sensor may be configured to detect displacement between the sensor itself and a separate detectable member. The sensor may be fixed relative to the first end of the flexure, and moveable relative to a detectable member that is fixed relative to the second end of the flexure. Alternatively, the sensor may be fixed relative to the second end of the flexure, and moveable relative to a detectable member that is fixed relative to first end of the flexure. Thus, by detecting the displacement between the sensor and the detectable member, the sensor may provide a measurement of the displacement of the first end of the flexure relative to its second end.

For example, the detectable member may be a magnet, and the sensor may be configured to sense magnetic field. Alternatively, the detectable member may be a metallic member, and the sensor may be configured to sense changes in an electric field. Alternatively, the detectable member may be a slotted photo-interrupter, and the sensor may be configured to sense changes in transmitted light.

Preferably, the sensor may be any sensor configured to provide an output proportional to the relative displacement of a corresponding detectable member.

This arrangement may be advantageously simple to calibrate and maintain, while providing accurate and repeatable measurements of displacement. For example, one of the sensor and the detectable member may be attached to a first end of the flexure, while the other is attached nearby to a portion of the apparatus that is fixed relative to the second end of the flexure. The sensor may then be calibrated over a range of relative displacements. This arrangement is more straightforward to set up than a piezoelectric or piezo resistive strain gauge, as in order for strain gauges to function they must be accurately bonded to the flexure at a position that provides the correct output level.

The bond test apparatus may further comprise a magnetic portion, and the sensor may be configured to sense a change in magnetic field. The magnetic portion may be any magnetised item, or portion of the apparatus, but is preferably a fixed pole diametric magnet, particularly preferably a diametrically magnetised disk magnet. Either the magnetic portion or the sensor may be fixed to, or fixed relative to, the first end of the flexure, while the other of the magnetic portion or the sensor is fixed relative to the second end of the flexure, such that displacement of the first end of the flexure relative to the second end causes the magnetic portion to move relative to the sensor, resulting in a change in the magnetic field experienced at the sensor. The sensor may therefore be termed a displacement sensor. The change in magnetic field at the sensor may advantageously be proportional to the displacement of the flexure.

In a particularly preferred embodiment, the sensor may comprise two or more sensors coupled together. Such an arrangement of coupled sensors may advantageously increase the magnitude of the output signal, such that the sensitivity of the apparatus is increased. The coupled sensors are preferably configured such that, when no force is applied to the flexure, the first end of the flexure, or optionally the magnet, is positioned between the two sensors. On application of a force to the flexure, the first end of the flexure, or the magnet, is displaced relative to the coupled sensors. The range of measurement of the sensors may be increased by providing two or more sensors, or two or more magnets, spaced along the direction of travel of the first end of the flexure.

Hall Effect Sensor

In a preferred embodiment, the sensor is a Hall effect sensor that is configured to output a potential difference (voltage) signal in response to a change in magnetic field. The Hall effect sensor is advantageously positioned in the vicinity of a magnet, so that the sensor senses the magnetic field of the magnet. Displacement of the magnet relative to the sensor creates a change in magnetic field at the sensor, creating a potential difference across the sensor that is directly proportional to the displacement of the magnet. Either the magnet or the Hall effect sensor may be fixed relative to the first end of the flexure, with the other of the magnet or the Hall effect sensor being fixed relative to the second end of the flexure. The output signal from the Hall effect sensor is proportional to the displacement of the magnet relative to the sensor, such that the Hall effect sensor provides a measurement of the displacement of the first end of the flexure. The Hall effect sensor may therefore be termed a displacement sensor.

Hall effect sensors advantageously produce a relatively large linear output in response to a small change in magnetic field. For example, a Hall effect sensor suitable for use in the present invention may provide an output signal with a magnitude of several volts in response to relative displacement of the magnet by 2 mm. This means that a Hall effect sensor provides an output signal the magnitude of which is significantly higher than the output of a conventional strain gauge of the type typically used to measure forces in bond testers. The large magnitude of the output from the Hall effect sensor means that there may be no need to amplify the output signal from the sensor before delivering the signal to a processor for processing. This means that the apparatus of the present invention may require fewer electrical components than a system measuring force using strain gauges, and may therefore introduce fewer potential sources of error into the values being measured.

As an example, a typical prior art foil strain gauge mounted on a flexure may be configured in a bridge configuration requiring an excitation voltage of 10V, and may give an output voltage of 0.0123V when fully loaded. A similar flexure using a Hall effect sensor according to the present invention may give an output of approximately 2.0V when fully loaded, and therefore needs no amplification before measuring the voltage.

Hall effect sensors may be particularly advantageous for use in measuring displacement in the present invention because they exhibit excellent resistance to creep.

According to a preferred embodiment, the invention may comprise a bond test apparatus comprising a test tool assembly, the test tool assembly comprising a test tool configured to contact a bond during a bond test. The bond test apparatus may additionally comprise a flexure coupled to the test tool assembly, a magnet, and a Hall effect sensor. One of the magnet or the sensor is fixed relative to a first end of the flexure, while the other of the magnet or the sensor is fixed relative to a second end of the flexure, and the Hall effect sensor is configured to sense a change in magnetic field when the first end of the flexure is displaced relative to the second end of the flexure on application of a force to the flexure. The bond test apparatus preferably comprises a processor configured to receive a signal from the Hall effect sensor and, based on the signal and a known stiffness of the flexure, to calculate the force on the flexure.

Possible Sensors

Instead of, or in addition to, a Hall effect sensor, the sensor may comprise an optical displacement sensor, for example a slotted photo-interrupter, a time of flight sensor, or an optical triangulation sensor. The sensor may comprise a magneto resistive or giant magneto resistive sensor, or a capacitive sensor.

Flexure

Preferably, the apparatus comprises more than one flexure, wherein the first ends of both flexures are coupled to one another, so that the first ends of both flexures are displaced by the same distance on application of a force. The flexure may be a folded beam flexure, or a serpentine flexure, or a linear (non-folded) flexure, as are known in the art. Particularly preferably, the apparatus comprises two or more flexures, configured so that the first ends of the flexures are moveable relative to the second ends only along a linear axis. For example, the apparatus may comprise a pair of flexures of the same length arranged one above the other in a vertical plane, in which the first ends of the flexures are coupled together, and are moveable only along a vertical axis. Such a configuration may eliminate or reduce lateral displacement of the flexures and ensure that the first ends of the flexures are always displaced linearly, so that the sensor may be configured to measure displacement along a single axis.

The flexure may be configured so that the test tool is fixed to one end of the flexure, such that application of a test force between the test tool and a bond being tested causes the flexure to bend. In such an arrangement, the sensor may be used to determine the magnitude of the test force between the tool and the bond.

Alternatively, the flexure may be a flexure configured to bend in response to a different force, such as a closing force on the jaws of a pull test tool. In this arrangement, the sensor may be used to determine the magnitude of the closing force on the jaws.

Test Tool

The test tool may be fixed to the first end of the flexure, such that application of a test force on the test tool by a bond causes a displacement of the first end of the flexure in a predetermined direction. The sensor is preferably configured to provide a measurement of this displacement, so that using the displacement of the first end of the flexure and a known stiffness of the flexure, the force on the flexure, and therefore the test force, can be calculated.

The test tool may be configured for use in a particular type of bond test. For example, the test tool may comprise a Cold Bump Pull (CBP) test tool comprising tweezer jaws configured to grip a bond. The test tool may comprise a shear test tool configured to apply a shear force to a bond. Alternatively, the test tool may comprise a push test tool. The test tool is advantageously made from a thermally conductive material, and preferably a material with a high thermal conductivity. Particularly preferably, the test tool is formed from a metal.

The test tool preferably has a test tool tip configured to contact the bond during a bond test.

Drive Mechanism

In a preferred embodiment, the bond test apparatus of the present invention may be configured to measure the closing force, or gripping force, applied to a bond by test tool jaws during a bond test.

The test tool may comprise opposing jaws and the test tool assembly may comprise a closing member, and a drive mechanism configured to apply a drive force to the closing member, such that the closing member applies a closing force to the jaws. In the absence of an applied closing force, the opposing jaws preferably return to an open position, spaced apart from one another. The closing member is preferably configured to translate a drive force from the drive mechanism into a closing force on the jaws of the test tool. The application of the closing force on the jaws, in use, forces the jaws together, such that the jaws contact and grip a bond positioned between the jaws.

Preferably, the drive mechanism comprises a drive mechanism distance sensor that is configured to measure a distance moved by the drive mechanism while applying the drive force to the closing member. The drive mechanism distance sensor may be an encoder, for example a rotary or linear encoder, configured to measure how far the drive mechanism has moved in a predetermined linear or angular direction.

Preferably, the bond test apparatus is configured to measure the separation, or distance, between jaws of the test tool. The bond test apparatus may be configured to measure the separation between test tool jaws using the drive mechanism distance sensor, such as a rotary or linear encoder. Measuring the separation between test tool jaws may advantageously allow the jaws to be opened to a predetermined separation for a specific bond test operation. For example, the jaws may be openable to a predetermined cleaning separation to allow cleaning of the inside of the jaws by a known method. The jaws may be openable to a predetermined pre-test separation, the pre-test separation being greater than the size of the bond to be tested, prior to positioning the jaws around a bond for testing. Measuring the separation of the jaws may thus advantageously allow more precise positioning of the test tool during operation.

The drive mechanism is preferably configured such that, when the jaws of the test tool grip a bond, application of the drive force displaces the first end of the flexure relative to the second end. Preferably, the drive mechanism and/or closing member are configured such that application of the drive force to the closing member does not displace the flexure until the jaws contact a bond. Once the jaws of the test tool contact a bond, however, further application of the drive force (and therefore the closing force), meets resistance from the bond material, so that the bond imparts a reaction force on the jaws. The magnitude of the reaction force may advantageously be proportional to the magnitude of the closing force exerted on the bond by the jaws. This reaction force is transmitted from the test tool, through the closing member, to the drive mechanism. The drive mechanism is preferably configured such that this reaction force causes the first end of the flexure to be displaced relative to the second end, by a distance that is proportional to the closing force on the jaws.

In a preferred embodiment, the drive mechanism is mounted on the first end of the flexure, the first end of the flexure being moveable relative to the test tool. The position of the test tool may be fixed, in use, relative to the second end of the flexure. Preferably, the drive mechanism is configured such that, when the jaws of the test tool grip a bond, application of the drive force creates a reaction force which acts on the drive mechanism and displaces the first end of the flexure relative to the second end. In this arrangement, the magnitude of the reaction force is proportional to that of the closing force exerted on the bond by the jaws, and the force on the flexure proportional to the reaction force. Measuring the force on the flexure thus provides a measurement of the closing force exerted on the bond by the jaws.

The effect of frictional forces in the apparatus may advantageously be minimised by using low friction materials and/or lubrication. Frictional forces may also be compensated for by calibration.

The drive mechanism preferably comprises an electric motor, which may be a geared electric motor. The drive mechanism preferably further comprises a lead screw and a nut. The nut may be mounted on the lead screw, and is preferably configured so that it cannot rotate. The motor may be configured to rotate the lead screw, such that the nut is moveable relative to the lead screw on rotation of the lead screw by the motor. The drive mechanism is preferably configured such that movement of the nut relative to the lead screw applies the drive force to the closing member.

In a preferred embodiment, the drive mechanism further comprises a lever, the nut being moveably engaged with a first end of the lever, and the lever being pivotable around a pivot point. Use of a lever amplifies the force from the drive mechanism, and may optionally allow the use of a less powerful drive mechanism, for example a smaller motor, to provide an adequate drive force. The drive mechanism may apply a force at the first end of the lever, which results in a relatively larger force at its second end, as a result of the ratio of the lever length on either side of the pivot point.

Preferably, the drive mechanism is configured such that, in use, movement of the nut along the lead screw moves the first end of the lever so that the lever pivots about its pivot point.

Preferably, the lever may be pivotable around a second end opposite its first end.

Preferably, the lever comprises a cam mechanism arranged to abut the closing member, the cam mechanism being configured such that pivoting of the lever about its second end, in use, causes the cam to apply the drive force to the closing member. The use of a lever and cam may advantageously amplify the magnitude of the drive force and/or the reaction force transmitted back through the closing member to the drive mechanism, such that a small travel of the drive mechanism can apply a greater drive force to the closing member, and such that the reaction force causes a greater deflection of the flexure, and is therefore measurable with greater accuracy.

Where the drive mechanism comprises a motor, the drive mechanism distance sensor may be an encoder configured to measure the distance that the motor travels while applying the drive force. For example, the encoder may count the number of rotations performed by the motor, or the lead screw.

Preferably, the lead screw comprises a thread with a fine pitch, such that a relatively high number of rotations are required for the nut to travel a given linear distance along the lead screw. This advantageously allows high resolution linear actuation of the nut, such that the encoder measures a high encoder count over the linear travel of the nut. This, preferably combined with a geared motor and a lever cam, reduces the power requirements of the motor, and allows accurate measurement of the distance moved by the drive mechanism while applying a high drive force at the cam surface.

Closing Member

The closing member may comprise a sleeve, or a collet, arranged to surround at least a portion of the jaws of the test tool. The sleeve may be axially moveable relative to the test tool, that is moveable along the axis of the test tool. The sleeve is preferably configured to engage with the jaws so that, in use, movement of the sleeve relative to the jaws applies the closing force to the jaws.

In a preferred embodiment, an outer surface of each of the jaws widens towards a tip end of the jaws, and a portion of the sleeve is configured such that its diameter is less than a diameter of an outer surface of the jaws in an open configuration. Thus, relative movement of the sleeve towards the tip end of the jaws applies a closing force which pushes the jaws together. Preferably, the sleeve is biased in a direction away from the tip end of the jaws, and the driving mechanism is configured to apply the drive force in a direction that moves the sleeve towards the tip end of the jaws. In this context, "tip end" means the end of the jaws that engage a bond during a test. However, it is possible to design the mechanism so that movement of the sleeve away from the tip end of the jaws forces the jaws together.

Particularly preferably, the sleeve is formed from a low friction material, such that force of friction between the sleeve and the jaws, in use, is at least 10 times, or 15 times, or 20 times smaller than the closing force on the jaws. This allows the sleeve to transmit the drive force to the jaws as a closing force with extremely low, or negligible, losses due to friction, and ensures that the closing force exerted on the bond by the jaws is accurately measured.

In a particularly preferred embodiment, the sleeve comprises a ceramic collar arranged concentrically around a portion of the jaws, such that in use the ceramic collar contacts the jaws and pushes the jaws together. The ceramic collar may advantageously provide a low friction contact surface between the sleeve and the test tool jaws.

The use of a sleeve, and optionally a ceramic collar, arranged to surround at least a portion of the jaws in the present invention may advantageously improve the concentricity of the closing force applied to the jaws. The sleeve of the present invention helps to spread the closing force so that the same force is applied evenly to each test tool jaw. This is particularly advantageous when gripping solder bumps, which are typically in the size range of 20 to 800 microns in diameter, as any lack of concentricity at this scale can lead to an unreliable test result.

Preferably, the closing member and/or the test tool may be configured such that the jaws of the test tool are controllable to close in several steps. For example, in a first configuration the test tool jaws may be fully open, such that the inside of the jaws may be inspected and cleaned. In a second configuration, the closing member may close the jaws such that the jaw separation is just larger than the diameter of the bond to be tested, so that the jaws may be placed over a bond without contacting other bonds on the substrate to be tested. In a third configuration, the closing member closes the test tool jaws such that they grip, and exert a closing force on, the bond. When the apparatus is in the third configuration, application of further drive force creates a reaction force, as described above, such that the reaction force causes a displacement of the first end of the flexure, the displacement being measured by the sensor. The signal from the sensor may then be used, together with a known stiffness of the flexure, to calculate the closing force exerted on the bond by the test tool jaws.

Second Flexure

In a preferred embodiment, the test tool assembly, a first sensor and a first flexure are mounted to the first end of a second flexure. The first end of the second flexure is advantageously moveable relative to a second end of the second flexure, and the apparatus additionally comprises a second sensor, the second sensor being configured to measure the displacement of the first end of the second flexure relative to the second end of the second flexure on application of a test force to the test tool by a bond.

The test tool assembly, the sensor and the flexure may be configured to measure the closing force exerted on the bond by the test tool jaws.

Preferably, the test tool assembly, the first sensor and the first flexure are configured to measure the closing force exerted on the bond by the test tool jaws, as described above. In other words, the test tool assembly may comprise a closing member and a drive mechanism as described above, and may be configured to measure closing force independently of the force on the second flexure.

Particularly preferably, the test tool is fixed relative to the first end of the second flexure, such that the application of a test force to the test tool by a bond causes displacement of the first end of the second flexure. Using the second sensor and a known stiffness of the second flexure, the test force on the test tool can be calculated, as described above.

Using this arrangement, both the closing force on the test tool jaws and the test force on the test tool can advantageously be measured. The closing force may first be measured, in use, by: positioning the test tool over a bond; operating the drive mechanism so that the jaws exert a closing force on the bond, thus creating a reaction force which causes displacement of the first flexure; measuring the displacement of the first flexure, and calculating the closing force between the jaws using the known stiffness of the first flexure. A test force is then applied between the test tool and the bond, so that the first end of the second flexure is displaced. The second sensor provides a measurement of the displacement of the second flexure, so that the test force on the second flexure can be calculated using the known stiffness of the second flexure.

Light Guide

When performing a bond test, it is necessary to illuminate the bond under test with sufficient light to permit accurate pre-alignment and set-up of the test, video recording and visual inspection of the test as it occurs, and subsequent visible inspection of the bond and test tool once it is complete.

Bond test machines are typically fitted with light stalks, which are flexible stalks with a light fitting on a free end. These are fixed to the bond test machine and can be manoeuvred into position to illuminate the test piece. However, providing illumination in this way has a number of problems. The light stalks are bulky, and can interference with other elements of bond test machine operation. The position of the light sources inevitably means that there is shadow and inconsistent illumination. The light stalk may be moved accidentally and may therefore require frequent re-adjustment. The remote position of the light sources means that illumination may not be optimised for use with miniature test pieces which are now becoming more commonplace (miniature in this context means in the size range of 20 to 100 µm (microns)).

Preferably, the bond test apparatus comprises one or more light sources fixed relative to the test tool configured to direct light from the one or more light sources to the test tool tip.

The one or more light sources may comprise a least one variable intensity light source.

In a preferred embodiment, the one or more light sources comprises at least one light emitting diode (LED). The one or more light sources may comprise a plurality of LEDs arranged around a circumference of the test tool and configured to emit light into the light guide.

Particularly preferably, the apparatus comprises a light guide fixed relative to the test tool and configured to direct light from the one or more light sources to the test tool tip.

The use of a light guide for illuminating the test tool tip may be particularly advantageous for the bond test apparatus according to the present invention, in particular for testing miniature test pieces. The light guide may also be particularly advantageous for use with "jawed" test tools. As CBP testing, for example, uses a test tool with a pair of jaws which must be precisely positioned around the bond for testing, the light guide may advantageously illuminate the test tool tip and the bond for testing, making it easier to correctly locate the test tool before a test.

The light guide may guide light from the one or more light sources to the test tool tip by total internal reflection of the light within the light guide. The light may travel through a solid translucent or transparent material of the light guide. Alternatively, or in addition, the light guide may be hollow and the light may reflect off internal reflective surfaces of the light guide. Advantageously, the light guide efficiently directs light from one or more remote light sources to a small area around the test tool tip. This allows low power light sources to be used and can provide for even illumination without shadows.

The light guide may be configured to focus light on the test tool tip. The light guide may comprise a lens configured to illuminate a predetermined area around the test tool tip. The light guide is tapered towards the test tool tip. A tapered portion of the light guide may be configured to direct light towards the test tool tip. Depending on the type of test to be performed and the area that it is desirable to illuminate, different light guides may be used to provide different illumination patterns. The light guide may comprise two or more portions movable relative to one another to provide for variable focussing of the light.

The light guide may comprise a tubular body configured to fit around the test tool, the light guide being configured to direct light, from a proximal end of the light guide to a distal end of the light guide. In particular, the light guide may surround at least a portion of the test tool. The test tool may fit within the light guide. The light guide may be shaped to fit closely around the test tool, so it takes up minimal space around the test tool. The light guide may be shaped to match the shape of the test tool. The light guide may completely surround a circumference of the test tool. This allows for even illumination around the test tool tip, without the test tool tip casting a strong shadow.

The bond test apparatus may comprise an interlock structure configured to mechanically interlock with a corresponding structure on a proximal end of the light guide.

In a preferred embodiment, the test tool assembly may be provided in a cartridge, which may be termed a load cell cartridge. The cartridge may have a housing, wherein the test tool is fixed to and extends from the cartridge housing. The cartridge may advantageously be a removable cartridge mountable on a bond test machine and configured to receive power from, and to exchange signals with, the bond test machine.

The light guide may be fixed to the test tool indirectly by being fixed to the cartridge. The light guide may be permanently fixed to the cartridge, but advantageously is removably fixable to the cartridge. Preferably, the light guide is fixed to the cartridge by a mechanical interlock. For example, the light guide may be fixed to the cartridge using a bayonet fitting or using a threaded connection. Alternatively, the light guide may be fixed to the cartridge using mechanical fixings such as screws, bolts or rivets.

Alternatively, or in addition, the light guide may be fixed directly to the test tool. The light guide may be permanently or removably fixed to the test tool. The light guide may be fixed to the test tool by a mechanical interlock. For example, the light guide may be fixed to the test tool using a bayonet fitting or using a threaded connection. Alternatively, the light guide may be fixed to the test tool using mechanical fixings such as screws, bolts or rivets.

Advantageously, the light guide can be manually removed from the cartridge or test tool without tools. In a preferred embodiment, the light guide can be twisted on and off of the cartridge or test tool to be manually removed.

The light guide may be formed from a moulded plastics material. Advantageously, the light guide is formed from an optical grade plastics material. For example, the light guide may be formed from acrylic. One or more surfaces of the light guide may be polished to provide a highly reflective surface. Alternatively, or in addition, one or more surfaces of the light guide may comprise a highly reflective coating. This may reduce unwanted leakage of light from the light guide. Advantageously, an exit surface of the light guide, through which light exits the light guide towards the test tool tip, is polished. This reduces unwanted scattering of the light.

The one or more light sources may be fixed directly or indirectly to the test tool. In a preferred embodiment, the one or more light sources are fixed to the cartridge to which the test tool is also fixed. The one or more light sources may comprise a plurality of different light sources. For example, the plurality of light source may comprise light sources of different colour or intensity. The one or more light sources may comprise a plurality of identical light sources.

Cartridge for a Bond Test Apparatus

According to a second aspect, the invention may provide a cartridge for a bond test apparatus. Preferably, the cartridge comprises the test tool assembly of the first aspect of the invention. The cartridge may advantageously be a removable cartridge mountable on a bond test machine and configured to receive power from, and to exchange signals with, the bond test machine.

The cartridge preferably comprises a test tool assembly, the test tool assembly comprising a test tool configured to contact a bond during a bond test. The cartridge additionally comprises a flexure coupled to the test tool assembly, and a sensor. The sensor is configured to provide a measurement of a displacement of a first end of the flexure relative to a second end of the flexure on application of a force to the flexure.

The cartridge may comprise one or more light sources fixed relative to the test tool, and a light guide fixed relative to the test tool and configured to direct from the one or more light sources to the test tool tip.

Further features of the cartridge and the light guide may be as described above in relation to the first aspect of the invention.

Providing a cartridge comprising the test tool assembly of the first aspect of the invention, and a light guide configured to illuminate the test tool tip, may make the cartridge particularly suitable for testing bonds of small diameters, for example 20 to 100 µm. As the invention may provide improved control of test tool jaw separation, and improved illumination of the test tool tip, the cartridge is precisely controllable for testing small bonds.

Method of Measuring a Force

According to a third aspect, the invention may provide a method of measuring a force in a bond test apparatus, the method comprising the steps of providing a flexure, the flexure having a first end moveable relative to a second end, and providing a displacement sensor. The method comprises the further steps of applying a force to the first end of the flexure, and measuring the displacement of the first end of the flexure relative to the second end of the flexure using the displacement sensor. The method further comprises the step of determining the force on the flexure using the measured displacement. The method may comprise calculating the force on the flexure based on the measured displacement and a known stiffness of the flexure.

Preferably the flexure, the sensor and the bond test apparatus are as described above in relation to the first aspect of the invention.

The step of calculating the force on the flexure may advantageously be carried out by a processor or controller.

The method may comprise the additional step of determining the stiffness of the flexure by applying a known force to the flexure and measuring the displacement of the first end of the flexure relative to the second end of the flexure.

Method of Measuring Closing Force

According to a fourth aspect, the invention may provide a method of measuring the closing force on, or closing position of, jaws on a bond test tool, the method comprising the steps of providing a flexure, the flexure having a first end moveable relative to a second end, providing a displacement sensor, and providing a drive mechanism mounted on the first end of the flexure. The method comprises the further steps of positioning the jaws of the bond test tool around a bond, and applying a closing force to the jaws of a test tool using the drive mechanism, such that the bond applies a reaction force which is transmitted through the jaws to the drive mechanism. As the drive mechanism is mounted on the first end of the flexure, the reaction force causes displacement of the first end of the flexure relative to the second end of the flexure.

The method further comprises the steps of measuring the displacement of the first end of the flexure relative to the second end of the flexure using the displacement sensor, and determining the force on the flexure using the measured displacement.

The method may comprise calculating the force on the flexure based on the displacement and a known stiffness of the flexure.

The step of applying a closing force to the jaws may comprise first applying a closing force such that the jaws contact the bond, and once the jaws are in contact with the bond, applying a further closing force to the jaws using the drive mechanism such that the bond applies a reaction force which is transmitted through the jaws to the drive mechanism.

The method may be a method of performing a bond test, or part of a method for performing a bond test.

Preferably, the bond test tool, the flexure, the displacement sensor and the drive mechanism are as described above in relation to the first aspect of the invention.

The method may comprise the additional step of determining the stiffness of the flexure by applying a known force to the flexure and measuring the displacement of the first end of the flexure relative to the second end of the flexure.

The step of calculating the force on the flexure may advantageously be carried out by a processor or controller. Particularly preferably, the controller may be programmed to control the drive mechanism based on the calculated force on the flexure. For example, the controller may control the drive mechanism to apply a closing force until a predetermined force on the flexure is measured.

Preferably, the method may comprise the step of measuring the separation of the jaws using a drive mechanism distance sensor. As described in relation to the first aspect, the drive mechanism distance sensor may be a linear or rotary encoder, configured to measure the linear or angular distance travelled by the drive mechanism.

According to a preferred embodiment, the method may comprise the step of controlling the drive mechanism to apply a predetermined closing force to the jaws of the test tool, and subsequently measuring the separation of the jaws. In other words, the closing force may be applied to the jaws of the test tool until the first end of the flexure has been displaced by a predetermined distance, at which point the separation of the jaws is measured by the drive mechanism distance sensor.

Alternatively, the method may comprise the step of controlling the drive mechanism to apply a closing force until the jaws reach a predetermined separation, and subsequently measuring the force on the flexure, so as to calculate the closing force exerted on the bond by the test tool. This may provide a useful method of assessing the properties of the material from which the bond is formed. For example, if the jaws are closed to a predetermined separation having exerted less closing force than expected, this may indicate that the bond is smaller than expected, or that the bond material is weaker and/or lower density than expected.

The method may comprise the step of using a light source fixed relative to the test tool to direct light onto the test tool tip. Preferably, the method may comprise the step of directing light onto a tool tip having a pair of jaws while positioning the jaws around the bond for testing.

Features described with reference to one aspect of the invention may equally be applied to other aspects of the invention. In particular, it should be clear that features described in relation to the first aspect of the invention may be applied to the second aspect of the invention, and features described in relation to the third and fourth aspects of the invention may be applied to one another.

BRIEF DESCRIPTION OF THE DRAWINGS

Embodiments of the present invention will now be described in detail, by way of example only, with reference to the accompanying drawings, in which:

FIG. 1E is a perspective view of the test tool cartridge of the bond test apparatus;

DETAILED DESCRIPTION

Bond Test Apparatus

Figure 1A:
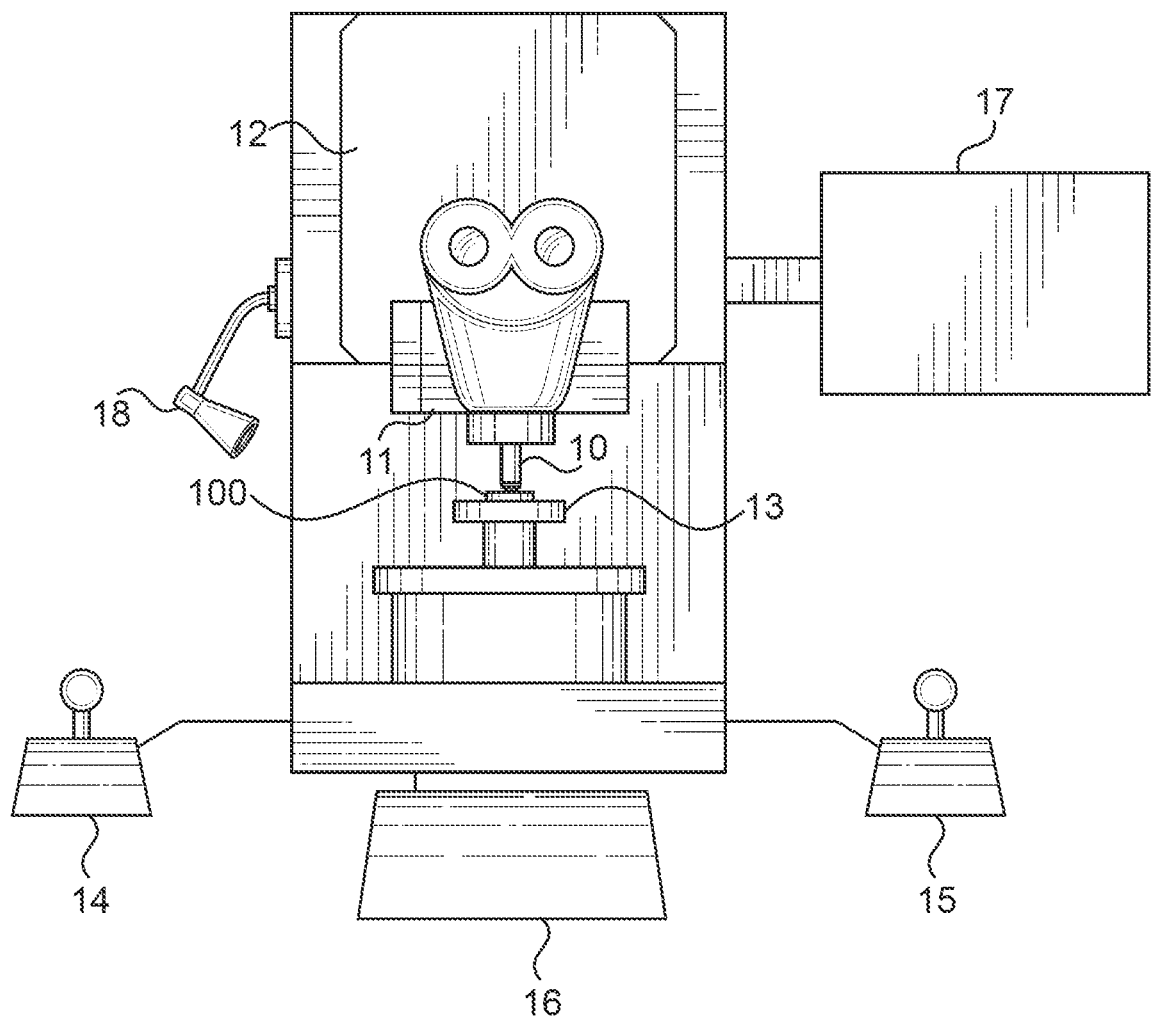
FIG. 1A is a simplified front view of a bond test apparatus that may be used with the present invention.

FIG. 1A is an illustration of a bond testing apparatus in accordance with the present invention. The apparatus comprises a test tool 10 mounted to a test tool cartridge 11, which is itself mounted to the main body of the bond test apparatus 12. Beneath the test tool, the bond test apparatus includes a motorized stage table 13, on which samples or substrates 100 to be tested can be mounted.

The test tool 10, mounted to cartridge 11, can be a shear tool, push tool or a pull tool and can be switched in order to perform different tests. Shear tools are used, for example, for applying a force horizontally across the board to shear a bond off the substrate, and push tools are used, for example, to apply a vertical compression force on a component on the substrate. The force applied by these tools is measured. A pull tool may, for example, have a hook at the bottom of the tool that is used to hook an electrical lead, which is attached between a component and a sample circuit board, with a vertical force being applied to the tool to pull the lead off the board and measure the force required to pull the lead off the board. An example of a suitable shear tool is described in U.S. Pat. No. 6,078,387, the contents of which are incorporated herein by reference. An example of a suitable pull tool is described in U.S. Pat. No. 6,310,971, the contents of which are incorporated herein by reference.

Figure 1B:
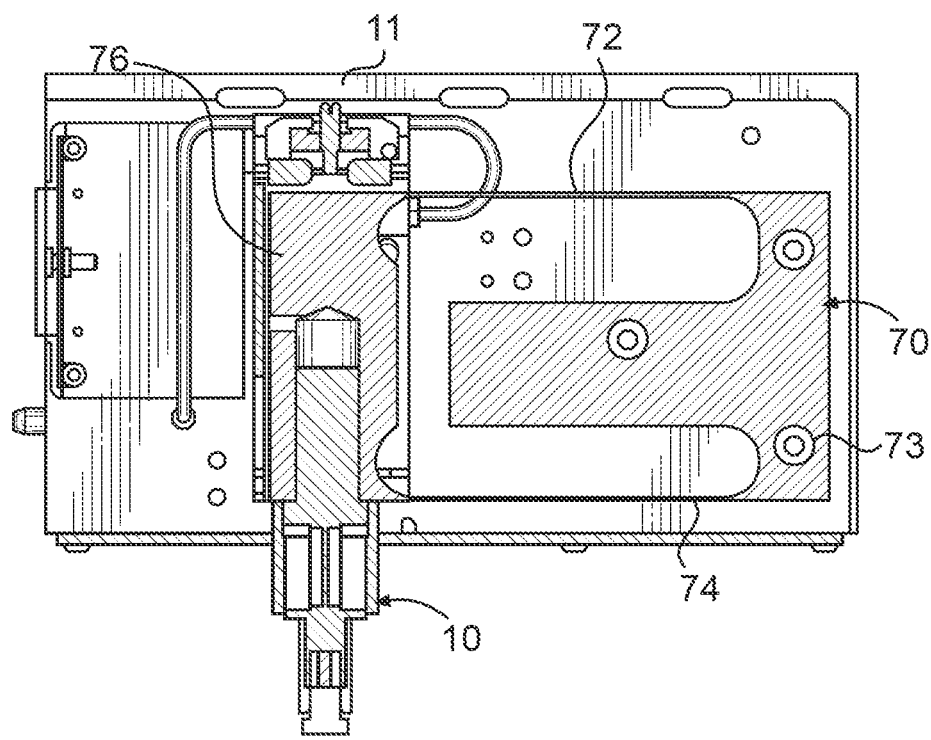
FIG. 1B is a cross-sectional view showing the test tool supported by the tool mounting bracket of the test tool cartridge of the bond test apparatus.
Figure 1C:
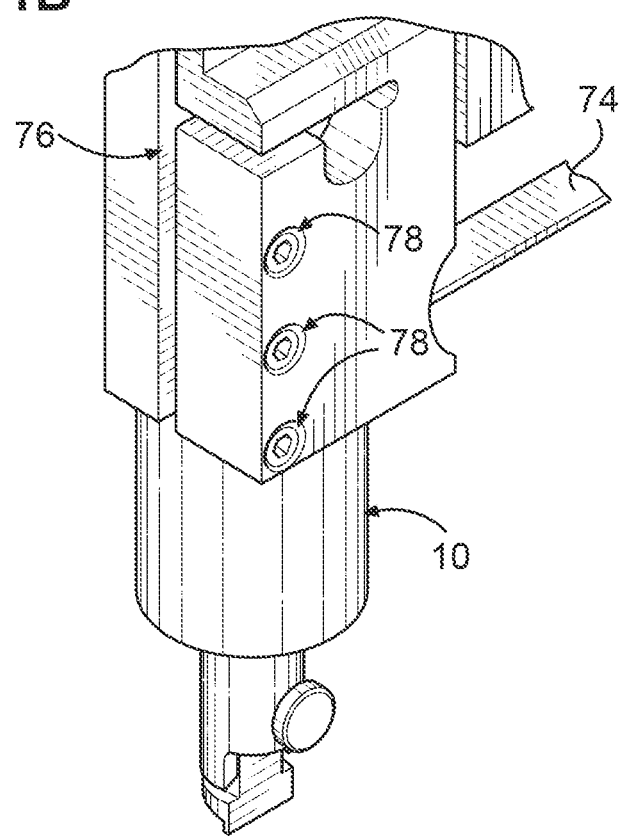
FIG. 1C is a perspective view showing the test tool clamped to the tool mounting bracket.

As shown in FIGS. 1B and 1E, the test tool 10 is typically attached to the cartridge 11 by a tool mount bracket 70 having cantilever arms 72, 74 fixed at one end to the cartridge 11 by screws 73, with the free ends of the arms 72, 74 supporting a clamp 76. As shown in FIG. 1C, the test tool 10 is clamped in clamp 76 by means of clamp screw 78. However, any suitable means for attaching a test tool to the cartridge mount plate may be used in a system in accordance with the present invention.

Figure 1D:
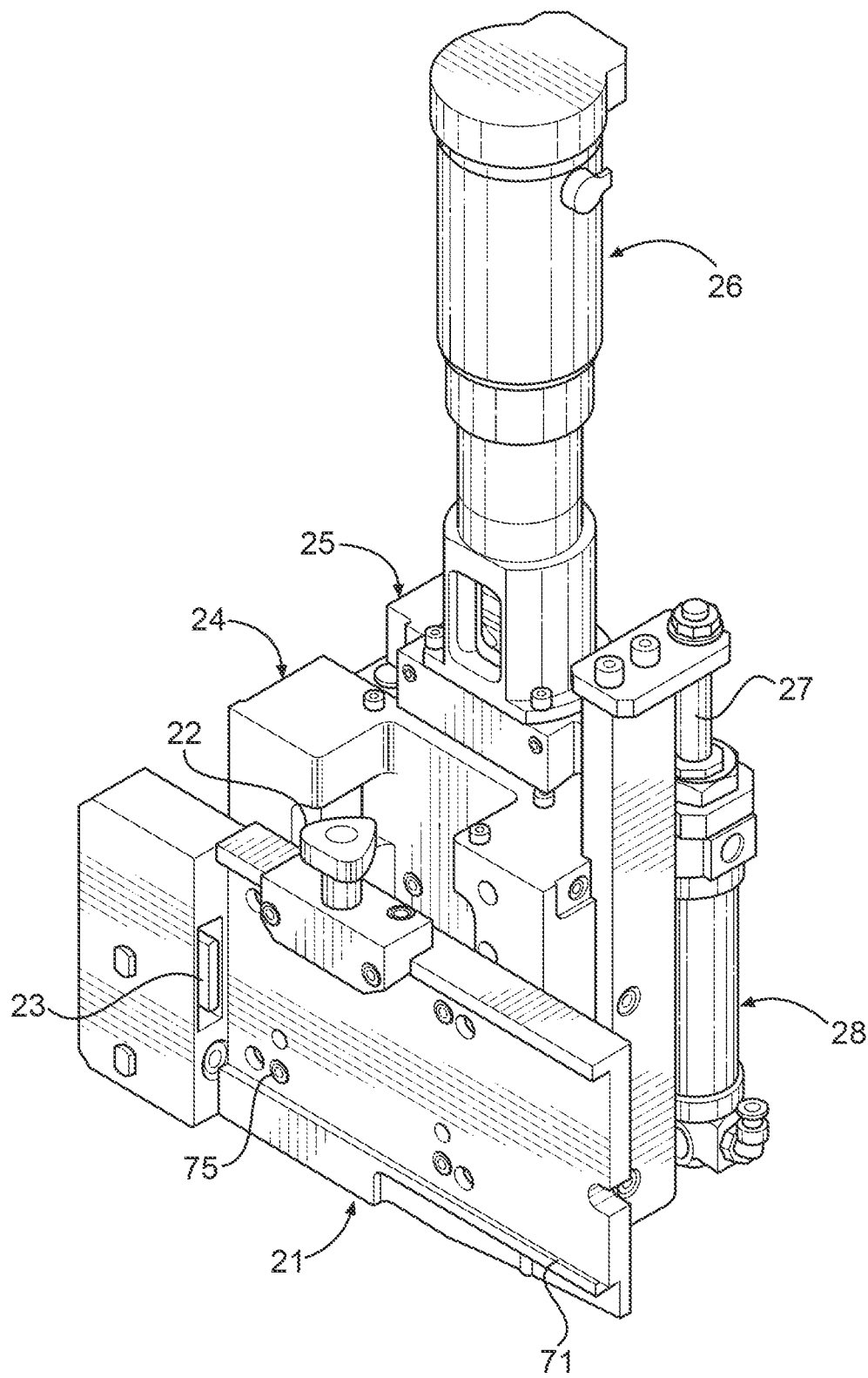
FIG. 1D is a perspective view of a test tool mount and drive portions of the bond test apparatus, including an anti-backlash cylinder.

FIG. 1D shows the retaining channel 71 on the cartridge mount plate 21 into which the test tool cartridge 11 is slid and then secured using one or more screws 22. This design permits different test tool cartridges, having different test tools, to be used with the bond test apparatus, as appropriate for the type of test that the user is conducting. The cartridge mount plate 21 includes a data port 23 that couples with an electrical connector on the test tool cartridge 11 for transferring data from the transducers of cartridge 11 to a PC, such as data representing the force required to shear a solder ball off a substrate or pull a lead off a substrate. An interchangeable test tool cartridge design for a bond test apparatus is well known in the prior art. See for example the Dage 4000 multipurpose bond tester available from Dage Holdings Limited.

The cartridge 11 is moveable in a z-direction normal to the surface of the substrate 100 on the stage table 13. This allows the test tool 10 to be positioned vertically relative to the substrate 100 under test so that it can contact a particular bond during a test. Relative x-y movement between the test tool 10 and the table 13 in a direction parallel to the plane of the substrate 100 is typically achieved by moving the table 13. Movement of the table 13 in x and y is achieved using suitable servo motors or stepper motors, coupled to the table 13 via a lead screw and nut, ball screw and nut, or suitable belt-drive mechanism (not shown), as is also well known in the prior art, such as the Dage 4000 Multipurpose Bond Tester referenced above.

Figure 1F:
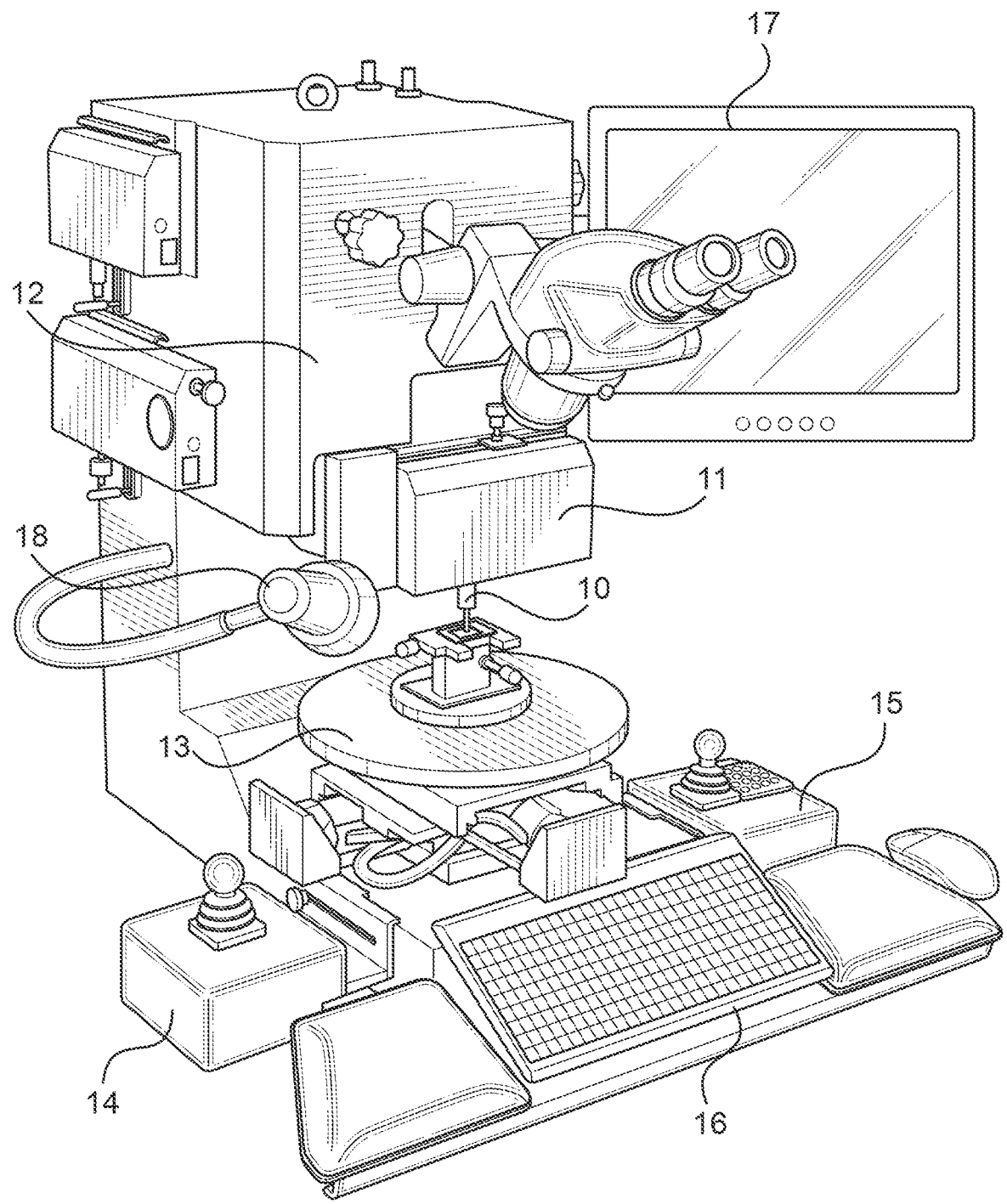
FIG. 1F is a perspective view of the bond test apparatus.

Also shown in FIGS. 1A and 1F are control devices, comprising two joystick controls 14, 15 to allow for controlling movement of the table 13, and a keyboard 16. A display 17, a light 18 for illuminating the substrate 100 under test, and a microscope, aiding accurate positioning of the test tool 10, are also shown. These features are also all well known in the prior art, such as the Dage 4000 Multipurpose Bond Tester referenced above.

FIG. 1D shows that the cartridge mount plate 21 and its connection to the main body 25. As has been described, the test tool (not shown in FIG. 1D) must be moveable towards and away from a substrate under test. This is achieved by moving the cartridge mount plate 21, to which the test tool 10 is attached, relative to the main body 25 of the device in a direction towards and away from the substrate, herein referred to as the z-axis direction or axial direction. The cartridge mount plate 21 is rigidly coupled to a moving block 24, using screws 75. The moving block 24 is coupled to the main body 25 via a ball screw (or lead screw) and nut and nut block (not shown) that are driven by a servo motor or stepper motor 26.

In order to remove the problem of backlash, an anti-backlash mechanism as described in U.S. Pat. No. 9,170,189 may be included. This mechanism is shown in FIG. 1D, and preferably comprises a pneumatic piston 27 and cylinder 28.

Bond Test Apparatus Using a Hall Effect Sensor

Figure 2:
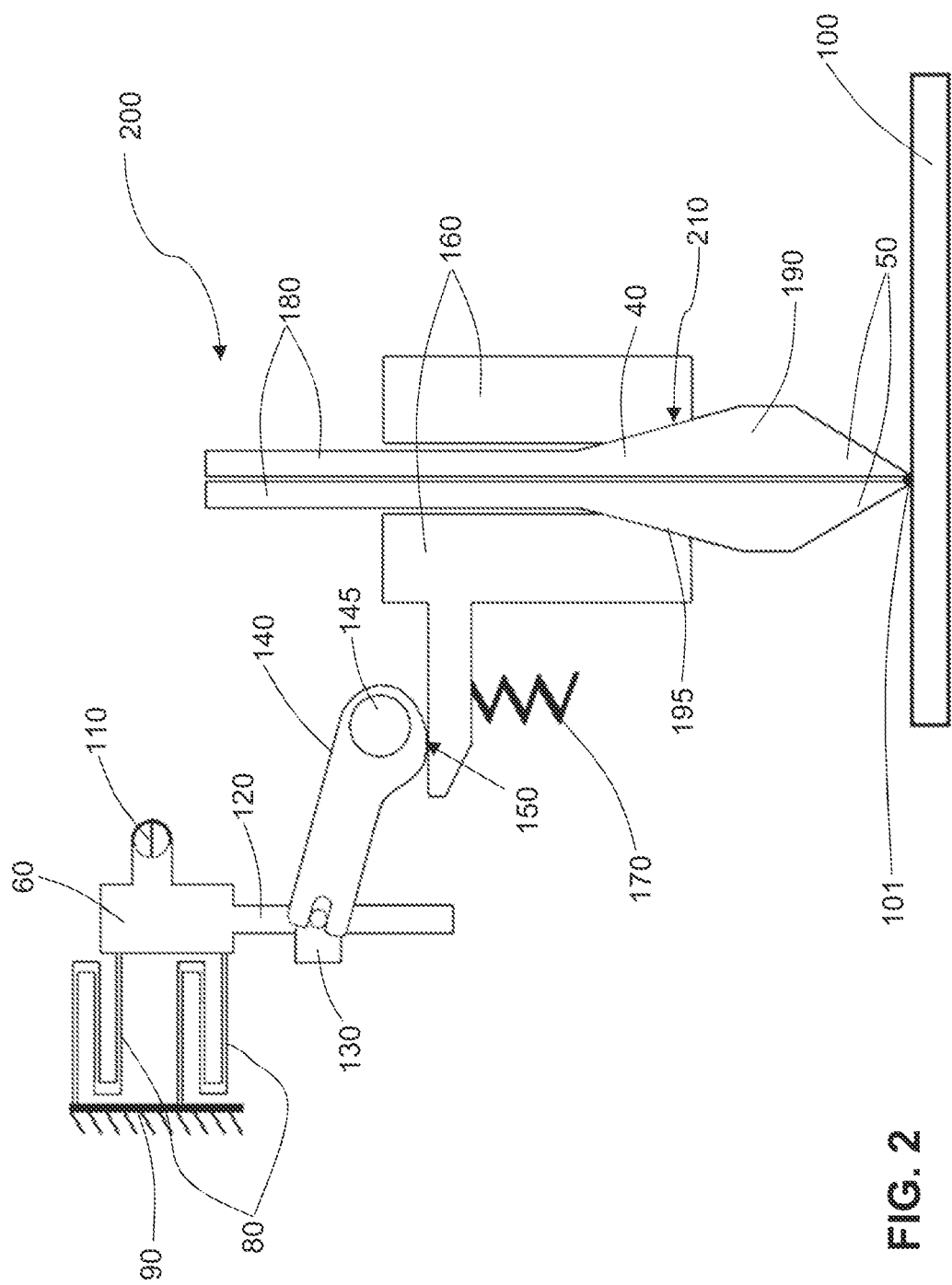
FIG. 2 is a schematic cross-section illustrating the key elements of a bond test apparatus according to a preferred embodiment of the present invention.

As shown schematically in FIG. 2, a first embodiment 200 of the bond test apparatus is configured to carry out a pull test using a pull test tool 40 with a pair of opposing jaws 50. The bond test apparatus comprises a geared motor 60 mounted on a first end of two serpentine flexures 80, which are configured one above the other so as to allow movement of the motor along a vertical axis. The second ends of the flexures are fixed to a surface 90, such that the first end of each flexure is moveable along a vertical axis relative to its fixed second end. As the motor is mounted on both flexures, movement of the motor along a vertical axis displaces the first ends of both flexures by the same distance.

A diametric disk magnet 110 is mounted to the first ends of the flexures 80, with its poles aligned with the axis along which the first ends of the flexures are moveable. A Hall effect sensor (not shown) is positioned adjacent the magnet 110 in the vertical plane in front of, or behind, the magnet as shown. The Hall effect sensor is fixed, i.e. not moveable, relative to the second end of the flexures 80, and the sensor is configured to provide an output voltage to a processor (not shown), the magnitude of which varies according to the magnetic field at the sensor.

The motor 60 is configured to rotate a threaded lead screw 120, which protrudes below the motor and lies along the motor's vertical axis of movement. Mounted on the lead screw is a nut 130, which is prevented from rotating by the first end of a lever 140. As the nut is prevented from rotating, rotation of the lead screw by the motor causes the nut to travel vertically along the lead screw.

The second end of the lever 140 comprises a fixed pivot point 145 and a cam surface 150, which is arranged to abut an upper surface of a collet 160. The collet is biased in an upward direction by a collet return spring 170, and the cam surface is shaped so that downward rotation of the lever about the pivot point causes the cam to impart a force to the collet which acts in a downward direction against the collet return spring.

The collet 160 is cylindrical, and is arranged coaxially around the vertically-disposed test tool 40 so that the collet surrounds the test tool. As the inner diameter of the collet is larger than the diameter of the test tool shaft 180, the collet is moveable along the vertical axis of the test tool shaft. The jaws 50 of the test tool are naturally biased apart, i.e. outwards, but a widened portion 190 of the jaws comprises a chamfered outer surface 195 which widens towards the tips of the jaws, such that the diameter of the widened portion is greater than the inner diameter of the collet. The lower end of the collet comprises a chamfered inner surface 210 configured to cooperate with the chamfered outer surface 195 of the jaws, but the diameter of the chamfered inner surface 210 is less than the widened portion 190.

The whole apparatus shown in FIG. 2, including the surface 90, is moveable relative to substrate 100. In a preferred embodiment, for example, the apparatus shown in FIG. 2 may be provided inside a test tool cartridge 11, as shown in FIGS. 1A and 1F.

Measuring the Closing Force

In use, a user may conduct a bond test by mounting a substrate 100 carrying a bond for testing on a stage (not shown), before positioning the apparatus 200 such that the pull test tool 40 is directly above the bond to be tested.

First Configuration

In a first configuration (not shown), the nut 130 is moved to the upper end of the lead screw 120, so that the cam 150 does not act against the collet return spring 170. The collet return spring is therefore fully extended and the collet 160 is biased towards the upper end of the test tool shaft 180, i.e. away from the widened portion 190 of the test tool. This moves the collet out of contact with the widened portion 190 of the test tool, so that the jaws 50 of the test tool can move apart. In this configuration the test tool jaws 50 can be inspected, and cleaned if necessary.

Second Configuration

Figure 3:
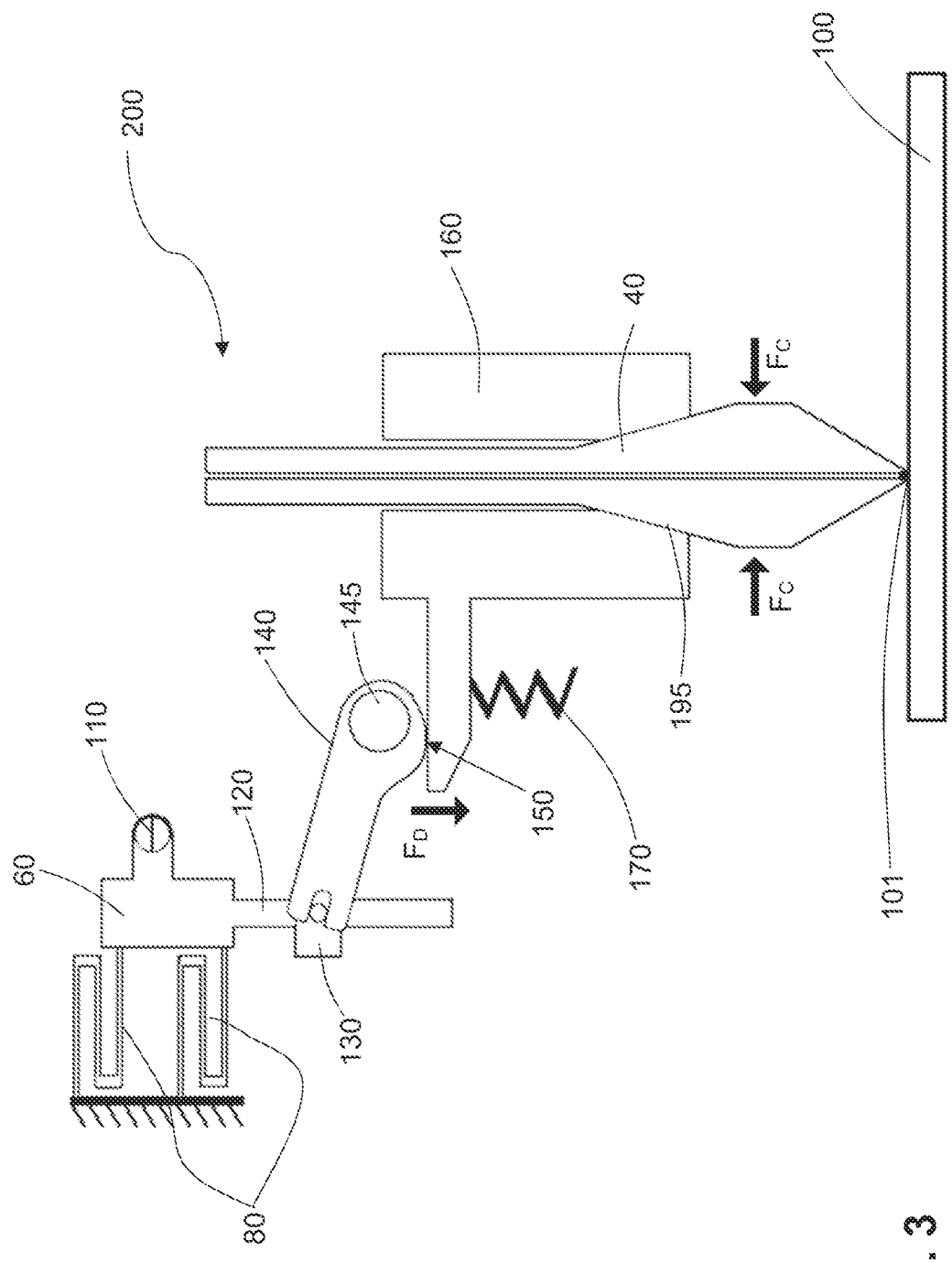
FIG. 3 is a schematic diagram illustrating the forces applied by the bond test apparatus of FIG. 2, in use.

Prior to moving the test tool 40 down over the bond to be tested, the apparatus adopts a second configuration shown in FIG. 3, in which the jaws 50 are closed until the jaw separation is only slightly greater than the diameter of the bond 101 to be tested. This allows the test tool jaws to be moved downwards into the plane of the bond to be tested, without contacting other bonds on the substrate 100.

The key forces on the system when adopting the second configuration are indicated in FIG. 3.

In order to adopt the second configuration, the motor 60 rotates the lead screw 120 by a predetermined number of rotations, such that the nut 130 travels down the lead screw by a predetermined distance. This causes rotation of the lever 140 about the pivot point 145, so that the cam surface 150 applies a linear drive force (indicated as $F_D$ on FIG. 3) to the collet 160 in a downward direction. This drive force acts against the collet return spring 170, and moves the collet 160 down the test tool shaft 180 so that the chamfered inner surface 210 of the collet engages the chamfered outer surface 195 of the test tool 40. As the inner diameter of the collet is smaller than the diameter of the widened portion of the test tool, the chamfered surfaces of the collet and test tool translate downward movement of the collet into a closing force (indicated as $F_C$ on FIG. 3) acting inwardly on the test tool jaws, which acts to force the jaws together. The predetermined number of lead screw rotations therefore results in the application of a predetermined closing force to the jaws, such that the jaws close to a predetermined separation.

As the jaws 50 do not contact a bond, or each other, when adopting the second configuration, the jaws do not experience any significant force resisting their closure (as the forces of the collet return spring and the open-bias of the jaws 50 are very low compared to the other forces at play).

The motor 60 therefore remains stationary on the first end of the flexures 80 while the lead screw 120 and nut 130 travel their predetermined distances without resistance. As the flexures are not displaced, the magnet stays stationary and the output of the Hall effect sensor (not shown) remains at zero volts.

Third Configuration

Once the tip of the test tool 40 is positioned in the same plane as the bond 101 to be tested, the apparatus adopts a third configuration in which the test tool jaws 50 contact and grip the bond. The third configuration is shown schematically in FIG. 4, and is adopted in the same way as the second configuration described above.

In order to move into the third configuration, the test tool jaws 50 are closed around the bond by controlling the motor 60 to rotate the lead screw 120, such that the nut 130 travels down the lead screw. This causes rotation of the lever 140 about the pivot point 145, so that the cam surface 150 applies a linear drive force ($F_D$) to the collet 160 in a downward direction. This drive force acts against the collet return spring 170, and moves the collet 160 further down the test tool shaft 180 so that the chamfered inner surface 210 of the collet acts against the widened portion 190 of the test tool jaws 50. The chamfered surfaces of the collet and test tool transmit the drive force to the jaws 50 as a closing force ($F_C$), so that the further the collet is moved down the test tool shaft 180, the greater the closing force applied to the jaws 50.

Figure 5:
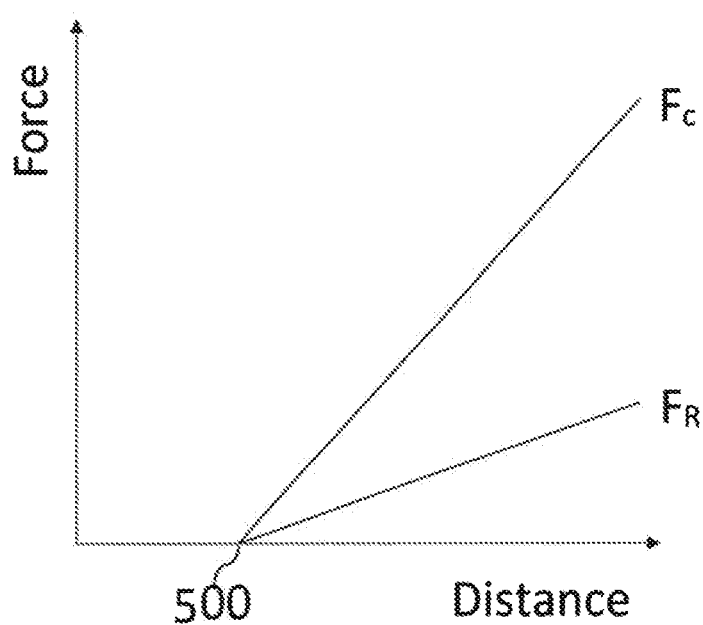
FIG. 5 is a graph illustrating the forces applied by the bond test apparatus of FIGS. 2, 3 and 4, in use.

FIG. 5 shows an example of the force measured by the Hall effect sensor as the nut 130 travels down the lead screw 120. The further the distance travelled by the nut down the lead screw, the smaller the separation of the jaws 50, so jaw separation decreases towards the right on FIG. 5.

FIG. 5 shows that until the point 500 at which the jaws contact the bond there is no force between the test tool jaws 50 and the bond, and therefore the Hall effect sensor measures no force on the flexures 80.

Once the test tool jaws 50 have been closed to a jaw separation equal to the diameter of the bond, the jaws contact and begin to grip the bond. However, once the jaws are in contact with the bond, the application of further closing force meets resistance from the bond itself. This resistance to being squeezed by the jaws creates a reaction force (indicated as $F_R$ on FIG. 4) between the bond and the jaws, the reaction force acting outwardly on the jaws, in the opposite direction to the closing force. This reaction force is transmitted back through the collet 160 so that the reaction force acts in the same direction as the collet return spring 170 and resists further rotation of the cam 150 and lever 140. This means that, while the motor 60 continues to rotate the lead screw 120, the reaction force resists further movement of the nut 130. Rather than only pushing the nut down the (effectively stationary) lead screw, further rotation of the lead screw therefore starts to displace the lead screw upwards through the nut. This upward movement of the lead screw also displaces the motor 60, so that the first ends of the flexures 80 are deflected.

Figure 4:
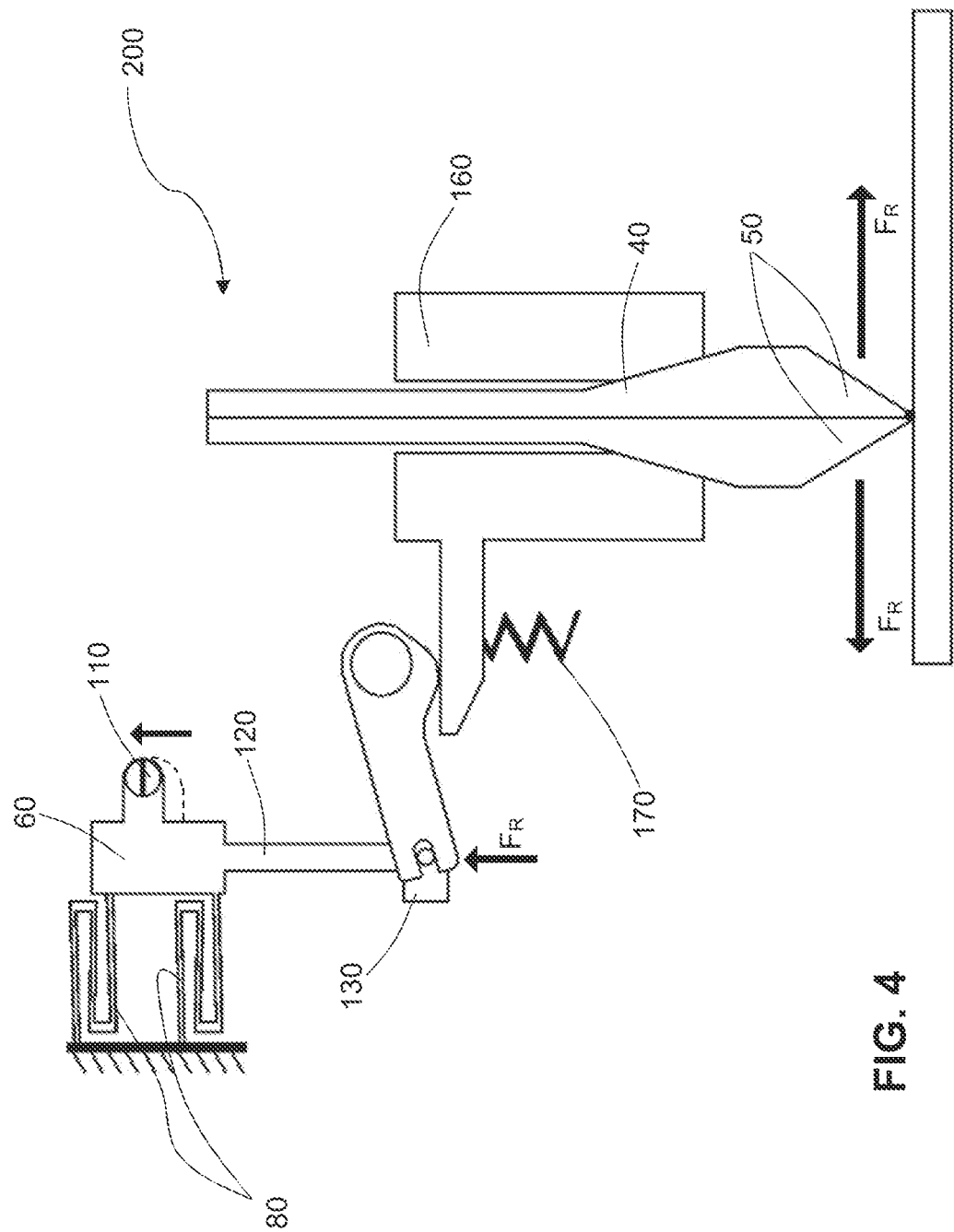
FIG. 4 is a schematic diagram illustrating the reaction forces experienced by the bond test apparatus of FIG. 2, in use.

Deflection of the first ends of the flexures 80 displaces the magnet 110 relative to the Hall effect sensor, as indicated on FIG. 4. This displacement means that the Hall effect sensor (not shown) senses a change in magnetic field that is directly proportional to the distance by which the magnet has been displaced. As the magnet displacement is equal to the displacement of the first ends of the flexures, the Hall effect sensor provides the processor (not shown) with a measurement of the displacement of the first ends of the flexures relative to their second ends.

The stiffness of the flexures 80 is known, so the processor can calculate the force ($F_R$) on the flexures based on the measured displacement.

As shown in FIG. 5, once the test tool jaws 50 contact the bond 101, the reaction force ($F_R$) is transmitted through the collet and the lever to the motor, so that the flexures 80 are displaced upwards. The displacement of the flexures 80 is sensed by the Hall effect sensor, and the reaction force ($F_R$) on the flexures is calculated by the processor based on the known stiffness of the flexures. As shown in FIG. 5, the reaction force ($F_R$) on the flexures 80 increases linearly as the distance between the jaws decreases. The magnitude of the reaction force experienced on the flexures is known to be smaller than the closing force experienced at the jaws, due to the force amplifying effect of the lever and collet. The closing force ($F_C$) applied to the bond by the test tool can therefore be calculated by the processor, taking into account the effect of the lever and the frictional forces in the system. The flexure and Hall effect sensor in this apparatus can therefore be used to measure the closing force applied between the jaws 50 and a bond being tested.

As shown on FIG. 5, the closing force ($F_C$) also increases linearly with the reaction force ($F_R$) as the distance between the jaws decreases.

By providing a feedback signal to the processor, the measurements from the Hall effect sensor can be used to control the apparatus, and therefore control the closing force applied to the bond during a bond test. This advantageously allows the processor to consistently apply a desired closing force to the bond in each test, or to close the jaws to a predetermined distance and then measure the resulting closing force.

Hall Effect Sensor

Figure 6A:
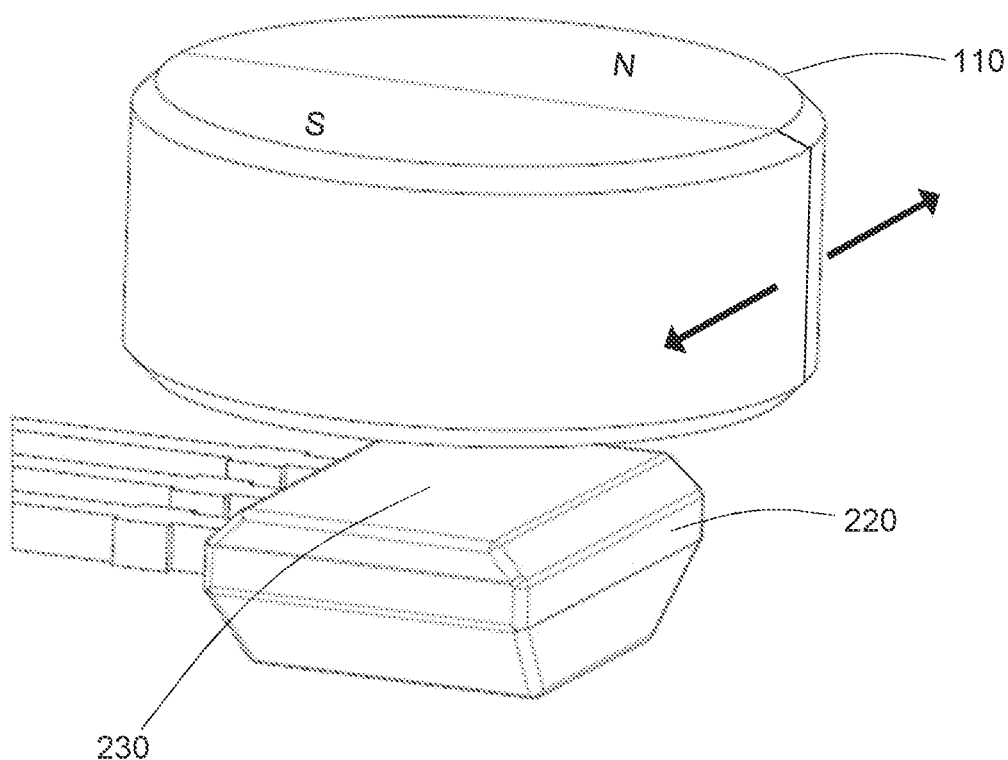
FIG. 6A is a perspective view of a single Hall effect sensor according to a first preferred embodiment of the present invention.

FIG. 6A shows a first embodiment of a Hall effect sensor 220 and diametric disk magnet 110, which is suitable for use in the present invention. As described in the summary of invention above, Hall effect sensors provide an output voltage, the magnitude of which depends on the magnetic field experienced at the sensor. Displacement of a magnet relative to the Hall effect sensor therefore creates a change in magnetic field at the sensor, which is shown as a change in the voltage output signal from the Hall effect sensor. In an alternative embodiment—shown in FIG. 6D—the sensor is an optical displacement sensor 222 (represented schematically in FIG. 6D) that is configured to detect a detectable member 112 (represented schematically in FIG. 6D), as discussed above.

The Hall effect sensor is arranged to sit adjacent to the magnet, out of the magnet's plane of movement. The sensing face 230 of the Hall effect sensor is arranged to face the magnet, such that displacement of the magnet relative to the sensor causes a change in the magnetic field experienced at the sensing face 230. The north (N) and south (S) poles of the magnet are aligned with the magnet's axis of movement (which is indicated by arrows) in order to maximise the change of magnetic field experienced by the sensor when the magnet moves along the axis.

Figure 6B:
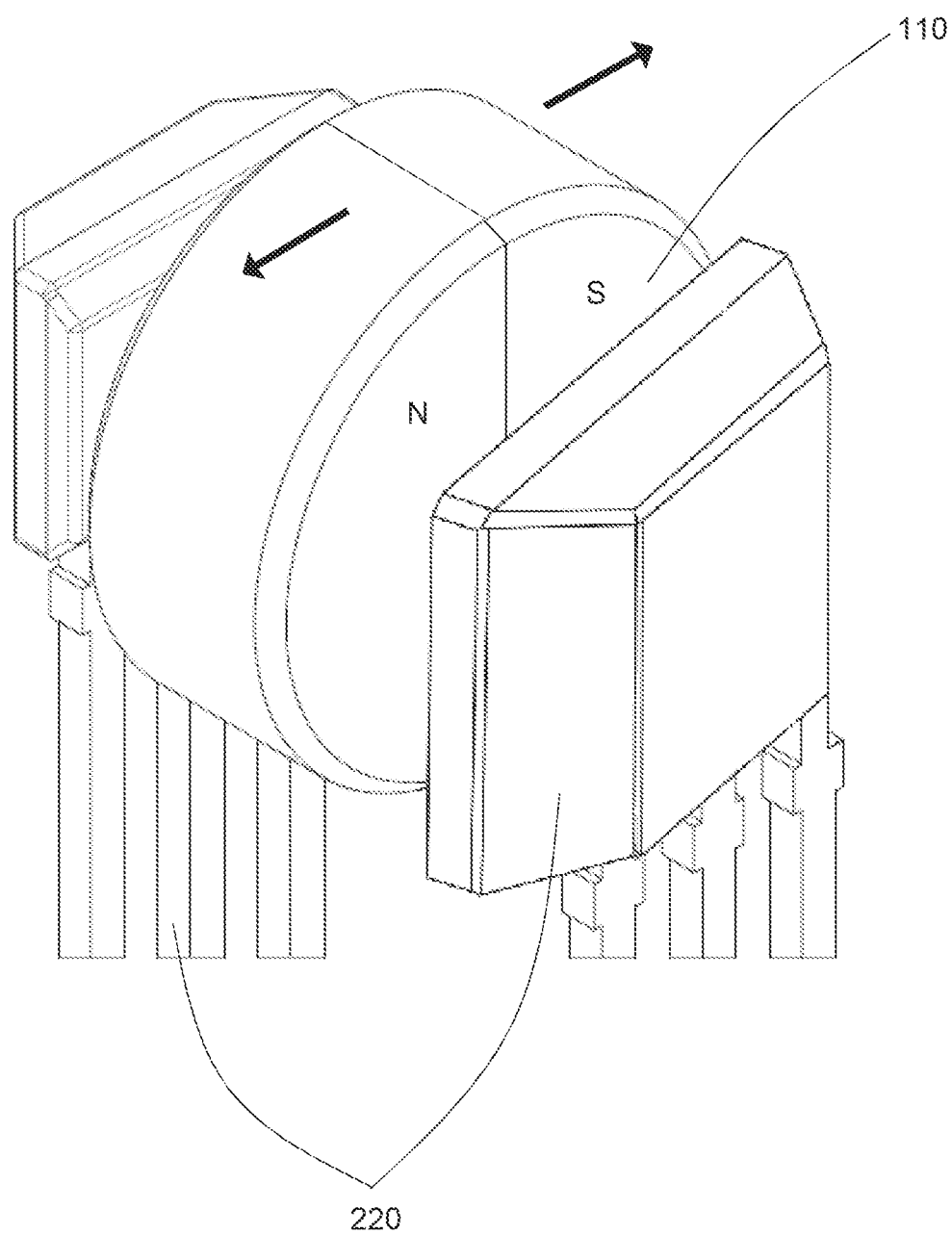
FIG. 6B is a perspective view of a dual Hall effect sensor according to a second preferred embodiment of the present invention.

As shown in FIG. 6B, in a second embodiment two Hall effect sensors 220 are used, with the sensors arranged opposite one another on either side of the magnet 110. By coupling the outputs of the two sensors, the magnitude of the output signal is increased, thus increasing the sensitivity of the apparatus.

Figure 6C:
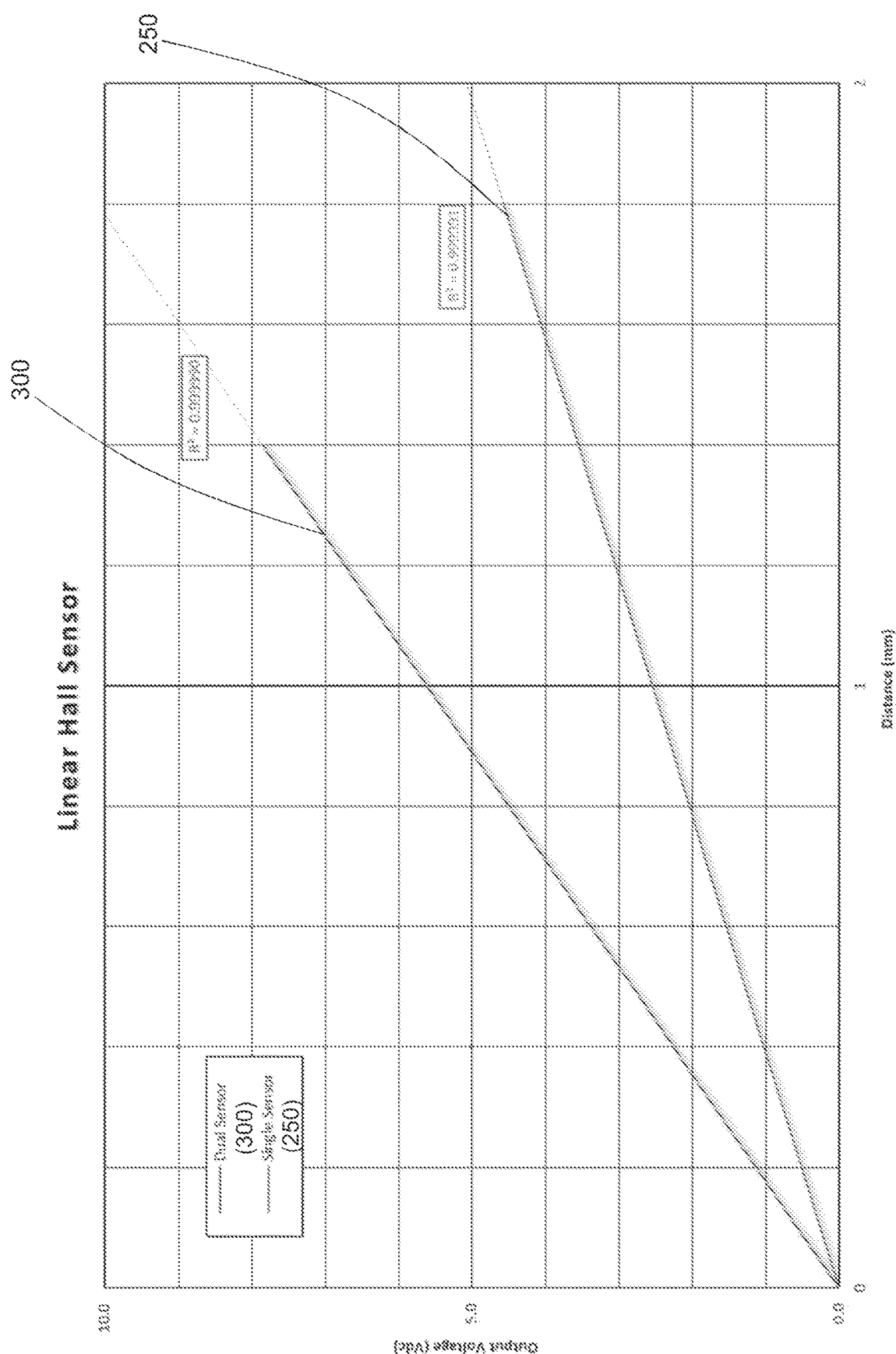
FIG. 6C is a graph illustrating exemplary output signals from the Hall effect sensors of FIGS. 6A and 6B.
Figure 6D:
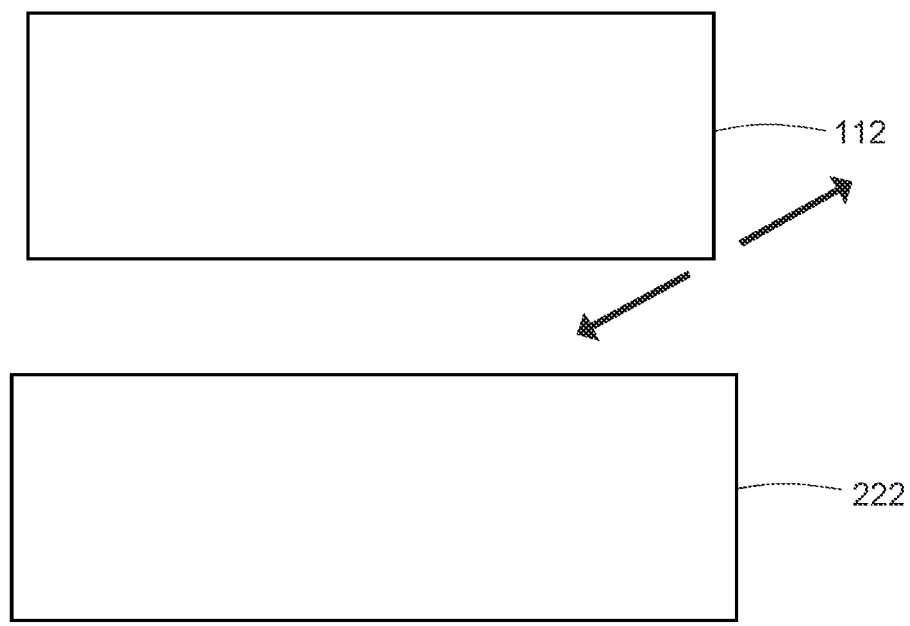
FIG. 6D is a schematic view of an optical displacement sensor according to an alternative embodiment to that shown in FIG. 6A.

As shown in FIG. 6C, the output voltage signal 250 from the single sensor of FIG. 6A, and the output voltage signal 300 from the dual sensors of FIG. 6B exhibit a highly linear correlation (as indicated by high $R^2$ values) with magnet displacement distance over short distances, for example up to 2 mm (0 to 1.8 mm in FIG. 6C), allowing small displacements to be measured to a high degree of accuracy. The output of even a single Hall effect sensor is also shown to vary by several volts per millimetre, allowing easy measurement without the need to amplify weak voltage signals. This accuracy, and the magnitude of the output signals, makes Hall effect sensors highly suitable for use with the present invention.

The Hall effect sensors 220 may be calibrated to compensate for a permanent offset between the magnet 110 and the sensors, but according to the preferred embodiments shown in FIGS. 6A and 6B, the centre of the magnet is aligned with the centre of the Hall effect sensor(s) when the magnet is at zero displacement. In this configuration, at zero displacement the Hall effect sensor experiences a net magnetic field of zero along the magnet's axis of movement, due to the symmetry of the magnet with respect to the sensor. Displacement of the magnet along the axis in either direction will alter this magnetic field, and so will create a non-zero output voltage from the Hall effect sensor.

Apparatus Example

Figure 7:
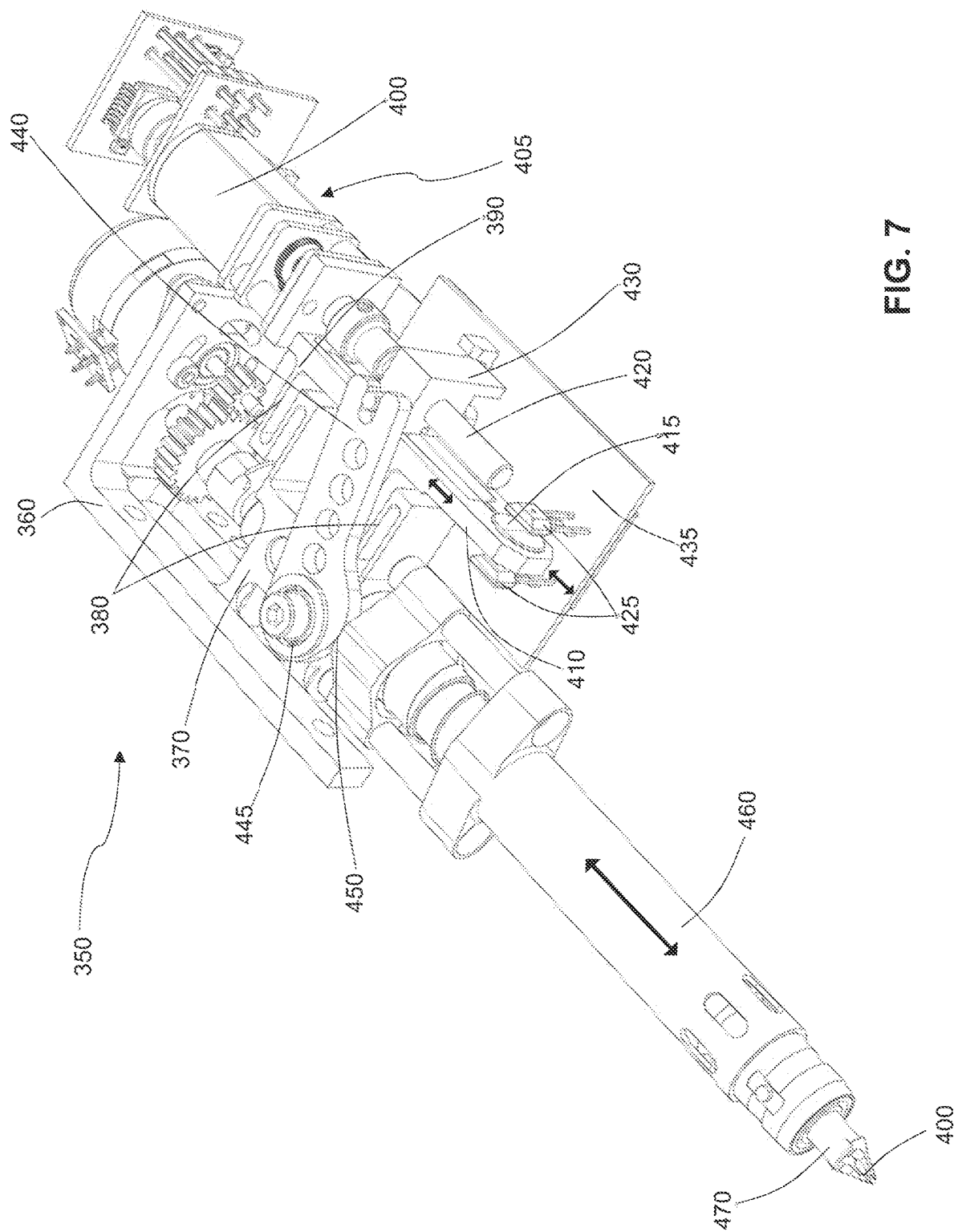
FIG. 7 is a perspective view of a portion of a bond test apparatus according to a preferred embodiment of the present invention.

FIG. 7 shows a preferred embodiment of the apparatus 350 of the bond test apparatus of the present invention, which is configured to be housed inside a cartridge 11 (not shown). The apparatus 350 shown in FIG. 7 is configured to measure the closing force exerted between a pull test tool 400 and a bond (not shown).

The apparatus 350 comprises a one-piece metal skeleton 360 to which a shared second end 370 of two folded beam flexures 380 is rigidly attached. The first ends 390 of the flexures are both rigidly attached to a geared electric motor 405 by a frame 410. The frame and motor are coupled together, and are moveable relative to the skeleton 360, such that any displacement of the motor leads to displacement of the first ends 390 of the flexures 380 relative to their second end 370. Due to the configuration of the flexures 380 adjacent to one another, the flexures 380 can only be displaced along a single axis (indicated on FIG. 7 by arrows), which is aligned with the axis of the test tool 400. Mounted on the frame 410 is a diametrically magnetised disk magnet 415, which is arranged so that its north and south poles are aligned with the axis of movement of the flexures 380. The magnet 415 is rigidly attached to the frame 410, so that any displacement of the frame also displaces the magnet.

Two Hall effect sensors 425 are mounted on a printed circuit board 435, so that the output voltage signals of the sensors are coupled and delivered to the printed circuit board. The printed circuit board is separate from the frame 410, and is fixed in position relative to the skeleton 360 and the second end 370 of the flexures 380. The Hall effect sensors 425 are arranged to face one another on opposite sides of the magnet 415, so that movement of the magnet between the sensors causes a change in the magnetic field sensed by the Hall effect sensors 425. This results in a change in the voltage output signals of the sensors.

A threaded lead screw 420, which is rotatable by the motor 405, projects out of the motor 405 and is disposed along the same axis as the test tool 400. A nut 430 is mounted on the lead screw. A portion of the nut 430 is slideably engaged with the frame 410, so that rotation of the lead screw 420 by the motor causes the nut to slide along the lead screw in a direction determined by the direction of the lead screw's rotation. The nut 430 is engaged with a first end of a lever 440, the second end of which is rotatably engaged with a pivot point 445. The pivot point 445 is fixed with respect to the skeleton 360. The second end of the lever comprises a cam surface 450 which is arranged to abut the upper surface of a sleeve 460.

The sleeve 460 is cylindrical and surrounds the test tool 400. The sleeve comprises a cylindrical ceramic collar 470 which is arranged around the test tool 400, and the entire sleeve 460 is slideably moveable relative to, and along the axis of, the test tool. The sleeve is not attached to the flexures 380, so movement of the sleeve does not directly deflect the flexures.

The pull test tool 400 is rotatable, but is otherwise fixed in position relative to the skeleton 360. The outer surface of the test tool comprises a widened portion disposed between the ceramic collar 470 and the tip of the test tool, and the jaws of the test tool are naturally biased into an open position. The diameter of the ceramic collar is smaller than the diameter of the widened portion of the test tool, so movement of the sleeve and collar towards the tip of the test tool creates a closing force which forces the jaws together.

The apparatus 350 is usable to measure the closing force applied to a bond by the jaws of the pull test tool 400. The operation of the apparatus 350 shown in FIG. 7 is as described with relation to FIGS. 2 to 4, with the sleeve 460 and ceramic collar 470 taking the place of the collet described in relation to FIGS. 2 to 4.

The apparatus 350 shown in FIG. 7 may optionally be mounted on the first end of a larger second flexure. If the skeleton 360, and therefore the test tool 400, are fixed stationary with respect to the second flexure, then application of a test force between the tool and a bond will lead to displacement of the first end of the second flexure. A second magnet may be mounted to the moveable first end of the second flexure, and a second Hall effect sensor may be fixed relative to a fixed second end of the second flexure. Measurement of the displacement of the second magnet by the second Hall effect sensor may therefore be used to measure the test force applied between the test tool and the bond being tested.

The whole apparatus shown in FIG. 7 is preferably provided inside a test tool cartridge 11, as shown in FIGS. 1A and 1F.

Cartridge Based Illumination Using a Light Guide

Figure 8A:
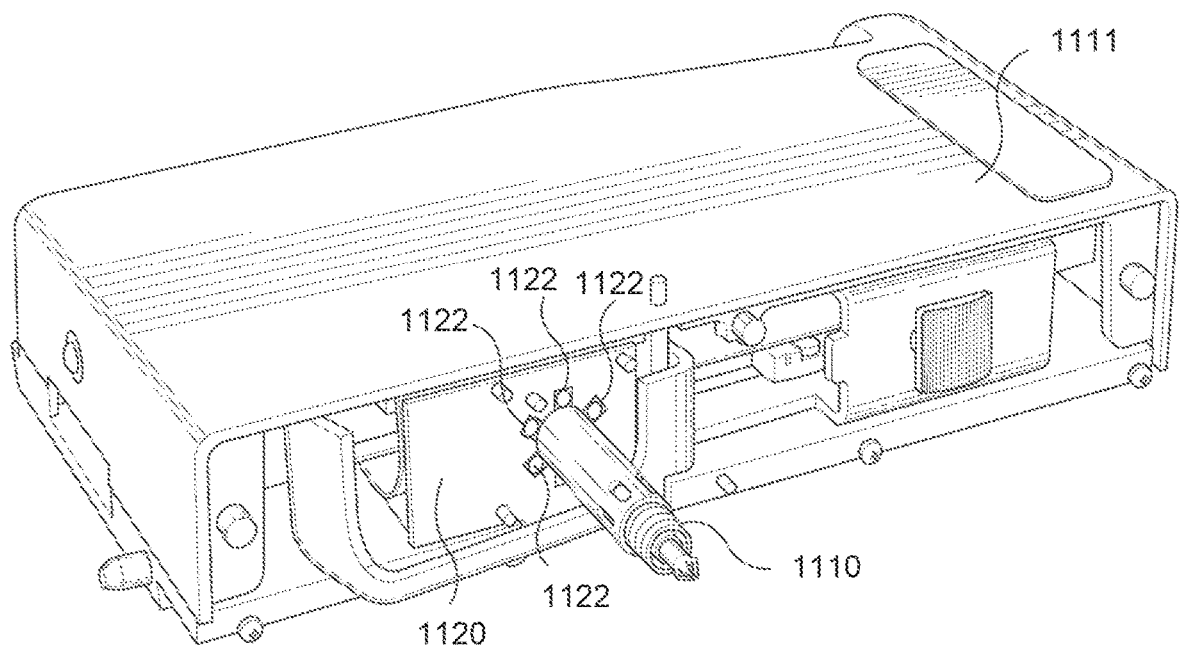
FIG. 8A is an underside perspective view of a cartridge in accordance with an aspect of the invention, with a light guide removed.

In an embodiment of the invention, in order to improve the illumination of the bond test, both for visual inspection and for video or photographic recording, a plurality of light emitting diodes (LEDs) are provided in the cartridge, positioned around the test tool. FIG. 8A illustrates a cartridge 1111 according to one embodiment of the invention comprising a pull test tool 1110 fixed to a cartridge mount plate in the manner described with reference to FIGS. 1B to 1F. The test tool 1110 has a generally cylindrical shape. Fixed to the cartridge and extending around the test tool 1110 is a printed circuit board (PCB) 1120 on which a plurality of LEDs 1122 are mounted. A portion of the housing of the cartridge is removed in FIG. 8A to show the PCB 1120. The LEDs form a ring around the test tool. The LEDs may be controlled to have variable brightness and may have different colours.

In order to use the light from the LEDs more efficiently, and to prevent the test tool casting a shadow over the test site, a light guide is fixed around the test tool to capture light emitted by the LEDs and focus it on the test site, around the tip of the test tool.

Figure 8B:
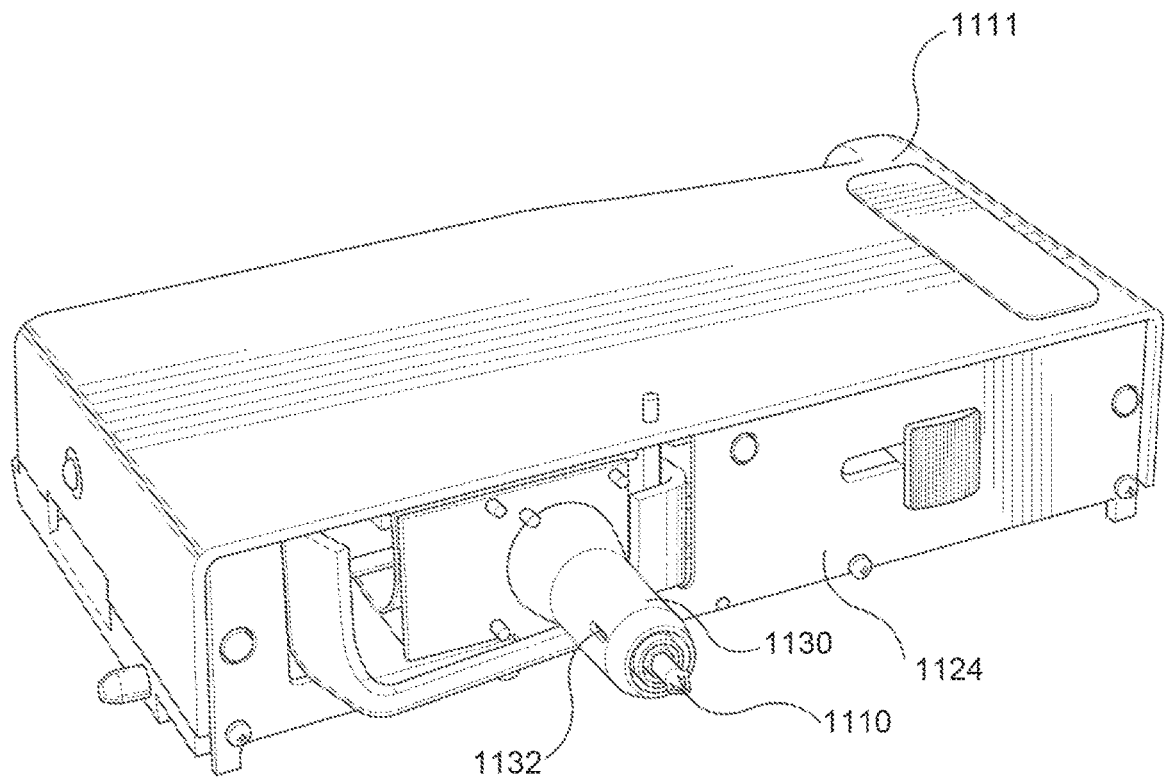
FIG. 8B is an underside perspective view of a cartridge in accordance with an aspect of the invention, with a light guide attached.

FIG. 8B illustrates the cartridge of FIG. 8A with the bottom plate 1124 of the housing fixed over the PCB 1120. A tubular light guide 1130 is mounted to the cartridge. The light guide 130 has a proximal end positioned adjacent to the LEDs 1122 and a distal end close to the test tool tip. The light guide 1130 is fixed to the bottom plate 1124 of the cartridge housing using a bayonet fitting, so it can be simply placed over the test tool and rotated by hand to lock it in place. The light guide can be removed from the cartridge by performing the reverse operation. In the embodiment shown, the light guide has a pair of slots 1132 provided in its sidewall that allow a tool to engage the test tool within the light guide, without having to remove the light guide from the cartridge. This may be desirable for some types of test tool but may not be necessary for other types of test tool.

Figure 9A:
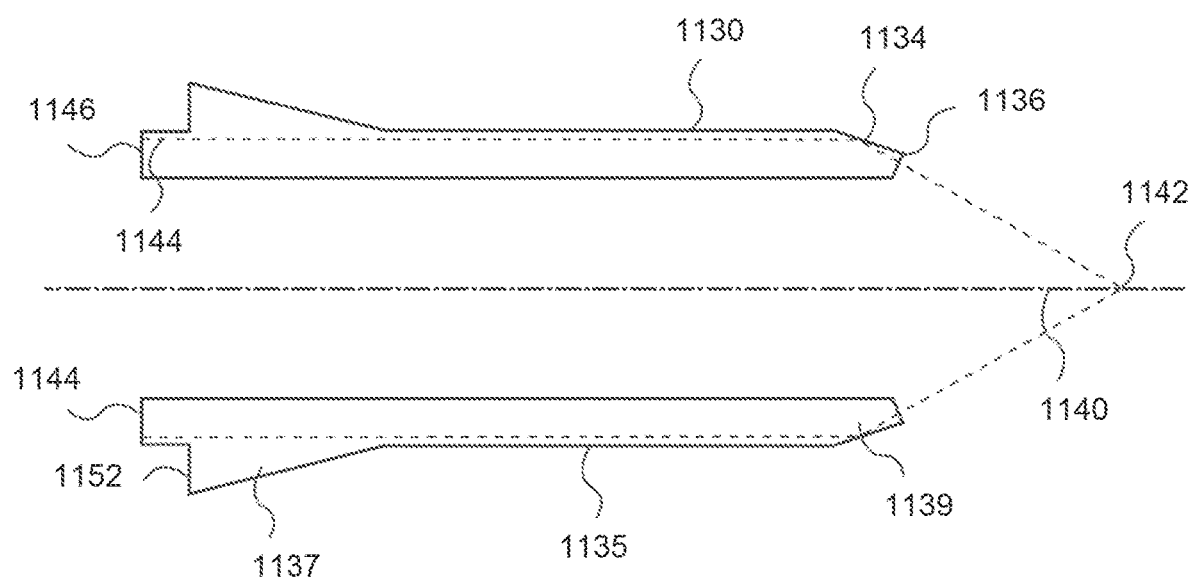
FIG. 9A is a cross section of the light guide of FIG. 8B.

Light emitted from the LEDs 1122 enters the proximal end of the light guide 1130 and is prevented from exiting through the side wall of the light guide by total internal reflection. The side wall of the light guide may be provided with a highly reflecting coating to ensure minimal light loss. The light guide has an exit surface 1136, as shown in FIG. 9A, at its distal end through which the light escapes. The light guide is tapered at its distal end in order to direct the light at the test tool tip.

The LEDs 1122 can have adjustable brightness. This is beneficial as different samples under test may require different brightness illumination. In this embodiment the brightness of the LEDs is controlled using an analogue control of the DC voltage. This differs from the more usual digital modulation of voltage to control LEDs, because modulation might generate noise that would interfere with proper operation of the test tool. The LEDs may also comprise LEDs that emit different colours that may be used to suit different samples under test.

Figure 9B:
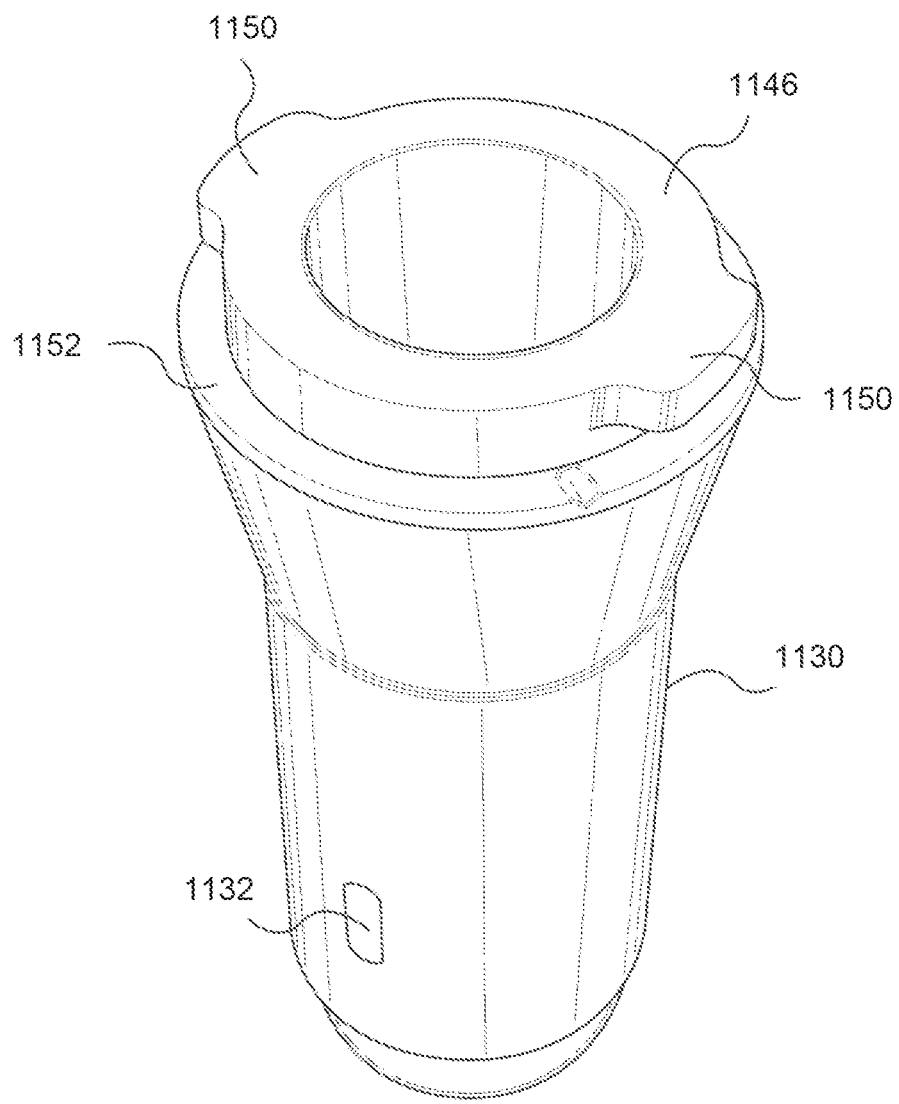
FIG. 9B is a perspective view of the light guide of FIG. 9A.

FIGS. 9A and 9B illustrate the light guide in more detail, removed from the test tool. FIG. 9A is a cross section of the light guide 1130. The light guide is generally tubular and is formed from acrylic. Other optical grade materials, such as glass or other optical grade plastics may be used. The light guide has a wall thickness of around 4 mm in a midsection 1135 but is wider at the proximal end 1137, where it engages the cartridge, and narrower at the distal end 1139 where light exits the light guide. The light guide is tapered at the distal end to direct the light towards the test tool tip. The light guide has an internal mirror face 1134 at the distal end, which in this example is at an angle of 13° to the longitudinal axis of the light guide.

Lines 1144 trace the path of light from the LEDs from entry through proximal surface 1146, through the light guide and exit from the light guide through exit surface 1136, to a point at the tip of the test tool 1142. Line 1140 shows the longitudinal axis of the light guide 1130.

FIG. 9B is a perspective view of the light guide of FIG. 9A and illustrates the bayonet fitting features 1150. The proximal end of the light guide has a pair of wings 1150 which extend radially from the main body of the light guide. The wings 1150 are received in corresponding slots in the bottom plate 1124 of the cartridge housing before being rotated to engage a rear surface of the bottom plate. Surface 1152 engages a front surface of the bottom plate.

A pair of slots 1132 are also provided in the sidewall of the light guide to allow for easy gripping of the light guide with a tool.

The provision of a light guide, as described, results in better illumination of the test site in an efficient and controllable manner. The lighting system does not interfere with the test tool operation or with any other aspect of the bond test apparatus, such as microscope viewing. The test tool does not cast a shadow on the test site. Similarly, shadows cast by other components close to the test site are minimised by using the light guide. A light guide can be inexpensively manufactured and easily fitted and removed by a user as necessary. The light guide may also provide some protection for the test tool.

The cartridge and test tool assembly of the present invention thus provides good illumination of the test tool tip and bond to be tested, and allows the jaws of a test tool to be opened, or closed, to a desired separation. This may advantageously allow improved control of test tool jaws, particularly when testing bonds of small diameter, as it is possible to position test tools more accurately around bonds prior to testing.

What is claimed is:

1. A bond test apparatus, comprising:
   a test tool having a test tool tip configured to contact a bond on a substrate during a bond test, and having a pair of opposing jaws biased into an open configuration, wherein the bond test apparatus is configured to carry out a pull test using the test tool with the pair of opposing jaws;
   a flexure coupled to the test tool;
   a closing member;
   a drive mechanism configured to apply a drive force to the closing member, such that the closing member applies a closing force to the jaws so as to close the jaws along a direction that is parallel to a surface of the substrate;
   a displacement sensor;
   a detectable member, in which one of the detectable member and the displacement sensor is fixed relative to a first end of the flexure and the other is fixed relative to a second end of the flexure, wherein the displacement sensor is configured to detect a displacement between the displacement sensor and the detectable member, so that the displacement sensor provides a measurement of a displacement of the first end of the flexure relative to the second end of the flexure on application of a force to the flexure; and
   a processor configured to receive a displacement signal from the displacement sensor and to determine the force on the flexure using the displacement signal.

2. The bond test apparatus of claim 1, wherein the processor is further configured to use the displacement signal together with a known stiffness of the flexure to determine the force on the flexure.

3. The bond test apparatus of claim 1, wherein the displacement sensor is further configured to output the displacement signal proportional to the displacement of the first end of the flexure.

4. The bond test apparatus of claim 1, wherein the detectable member comprises a magnetic portion, wherein one of the magnetic portion and the displacement sensor are fixed relative to the first end of the flexure, and wherein the displacement sensor is configured to sense a change in magnetic field, such that displacement of the first end of the flexure relative to the second end causes the magnetic portion to move relative to the displacement sensor, and the displacement sensor senses a change in magnetic field.

5. The bond test apparatus of claim 1, wherein the displacement sensor is a Hall effect sensor.

6. The bond test apparatus of claim 1, wherein the displacement sensor is an optical displacement sensor.

7. The bond test apparatus of claim 1, wherein the test tool is fixed to the first end of the flexure, such that application of a test force on the test tool by the bond causes a relative displacement of the first end of the flexure.

8. The bond test apparatus of claim 1, wherein the drive mechanism comprises a drive mechanism distance sensor configured to measure a distance moved by the drive mechanism while applying the drive force to the closing member.

9. The bond test apparatus of claim 1, wherein the drive mechanism is configured such that, when the jaws of the test tool grip the bond, application of the drive force displaces the first end of the flexure relative to the second end.

10. The bond test apparatus of claim 1, wherein the drive mechanism is mounted on the first end of the flexure, the first end of the flexure being moveable relative to the test tool, and wherein the drive mechanism is configured such that, when the jaws of the test tool grip the bond, application of the drive force creates a reaction force between the closing member and the drive mechanism which displaces the first end of the flexure relative to the second end.

11. The bond test apparatus of claim 1, wherein the closing member comprises a sleeve arranged to surround at least a portion of the jaws, wherein the sleeve is axially moveable relative to the jaws, and is configured to engage with the jaws so that movement of the sleeve relative to the jaws applies the closing force to the jaws.

12. The bond test apparatus of claim 11, wherein the sleeve comprises a friction material, such that force of friction between the sleeve and the jaws, in use, is at least 10 times less than the closing force on the jaws.

13. The bond test apparatus of claim 11, wherein the sleeve is biased in a direction away from the jaws, and wherein the driving mechanism is configured to apply the drive force in a direction that moves the sleeve towards the jaws.

14. The bond test apparatus of claim 1, wherein the drive mechanism comprises:
   a motor;
   a lead screw; and
   a nut mounted on the lead screw,
      wherein the motor is configured to rotate the lead screw, such that the nut is moveable relative to the lead screw on rotation of the lead screw by the motor, and
      wherein the drive mechanism is configured such that movement of the nut relative to the lead screw applies the drive force to the closing member.

15. The bond test apparatus of claim 14, wherein the drive mechanism further comprises a lever, and wherein the nut is moveably engaged with a first end of the lever, the lever being pivotable around a second end opposite the first end, such that, in use, movement of the nut along the lead screw moves the first end of the lever so that the lever pivots about its second end.

16. The bond test apparatus of claim 15, wherein the lever comprises a cam mechanism arranged to abut the closing member, the cam mechanism being configured such that pivoting of the lever about its second end, in use, causes the cam to apply the drive force to the closing member.

17. The bond test apparatus of claim 1, wherein the flexure is a first flexure, wherein the test tool, the displacement sensor, and the first flexure are mounted to a first end of a second flexure, the first end of the second flexure being moveable relative to a second end of the second flexure, and wherein the bond test apparatus further comprises a second sensor, the second sensor being configured to measure the displacement of the first end of the second flexure relative to the second end of the second flexure on application of a test force to the bond by the test tool.

18. The bond test apparatus of claim 17, wherein the test tool, the first flexure, and the first sensor are configured to measure the closing force on the jaws.

19. The bond test apparatus of claim 1, the bond test apparatus further comprising one or more light sources fixed relative to the test tool configured to direct light from the one or more light sources to the test tool tip.

20. The bond test apparatus of claim 1, wherein the drive force displaces the first end of the flexure relative to the second end of the flexure proportionally to the closing force of the jaws on the bond when the jaws are in contact with the bond.

21. A cartridge for a bond test apparatus, the cartridge comprising:
 a test tool having a test tool tip configured to contact a bond on a substrate during a bond test, and having a pair of opposing jaws biased into an open configuration, wherein the cartridge is configured to carry out a pull test using the test tool with the pair of opposing jaws;
 a flexure coupled to the test tool;
 a closing member;
 a drive mechanism configured to apply a drive force to the closing member, such that the closing member applies a closing force to the jaws so as to close the jaws along a direction that is parallel to a surface of the substrate;
 a displacement sensor;
 a detectable member, in which one of the detectable member and the displacement sensor is fixed relative to a first end of the flexure and the other is fixed relative to a second end of the flexure, wherein the displacement sensor is configured to detect a displacement between the displacement sensor and the detectable member, so that the displacement sensor provides a measurement of a displacement of a first end of the flexure relative to a second end of the flexure on application of a force to the flexure.

22. The cartridge of claim 21, the cartridge further comprising one or more light sources fixed relative to the test tool, and a light guide fixed relative to the test tool and configured to direct light from the one or more light sources to the test tool tip.

23. The cartridge of claim 21, wherein the drive force displaces the first end of the flexure relative to the second end of the flexure proportionally to the closing force of the jaws on the bond when the jaws are in contact with the bond.

24. A method of measuring a force in a bond test apparatus, the method comprising:
 providing a test tool having a test tool tip configured to contact a bond on a substrate during a bond test, and a pair of opposing jaws biased into an open configuration, wherein the bond test apparatus is configured to carry out a pull test using the test tool with the pair of opposing jaws;
 providing a flexure having a first end moveable relative to a second end;
 providing a closing member;
 providing a drive mechanism configured to apply a drive force to the closing member, such that the closing member applies a closing force to the jaws so as to close the jaws along a direction that is parallel to a surface of the substrate;
 providing a displacement sensor and a detectable member, in which one of the detectable member and the displacement sensor is fixed relative to the first end of the flexure and the other is fixed relative to the second end of the flexure, wherein the displacement sensor is configured to detect a displacement between the displacement sensor and the detectable member;
 applying a reaction force to the first end of the flexure;
 measuring displacement of the first end of the flexure relative to the second end of the flexure using the displacement sensor; and
 determining the reaction force on the flexure using the measured displacement.

25. The method of claim 24, wherein determining the reaction force comprises calculating the reaction force on the flexure based on the measured displacement and a known stiffness of the flexure.

26. A method of measuring a closing force on a pair of opposing jaws of a bond test tool of a bond test apparatus, the method comprising:
 providing the bond test tool having a test tool tip configured to contact a bond on a substrate during a bond test, and the pair of opposing jaws biased into an open configuration, wherein the bond test apparatus is configured to carry out a pull test using the bond test tool with the pair of opposing jaws;
 providing a flexure having a first end moveable relative to a second end;
 providing a closing member;
 providing a displacement sensor and a detectable member, in which one of the detectable member and the displacement sensor is fixed relative to the first end of the flexure and the other is fixed relative to the second end of the flexure, wherein the displacement sensor is configured to detect a displacement between the displacement sensor and the detectable member;
 providing a drive mechanism mounted on the first end of the flexure and configured to apply a drive force to the closing member, such that the closing member applies the closing force to the jaws so as to close the jaws along a direction that is parallel to a surface of the substrate;
 positioning the jaws of the bond test tool around the bond;
 applying the closing force to the jaws of the bond test tool using the drive mechanism, such that the bond applies a reaction force through the jaws to the drive mechanism, the reaction force causing displacement of the first end of the flexure relative to the second end of the flexure;
 measuring the displacement of the first end of the flexure relative to the second end of the flexure using the displacement sensor; and
 calculating the reaction force on the flexure using the measured displacement.

27. The method of claim 26, wherein applying the closing force to the jaws comprises:
 applying the closing force such that the jaws contact the bond; and
 applying a further closing force to the jaws such that the bond applies the reaction force through the jaws to the drive mechanism.

28. The method of claim 26, wherein calculating the reaction force comprises calculating the reaction force on the flexure based on the measured displacement and a known stiffness of the flexure.

29. The method of claim 28, wherein applying the closing force to the jaws comprises applying the closing force until the force on the flexure reaches a predetermined value and then measuring a separation of the jaws.

30. The method of claim 26, further comprising measuring the separation of the jaws using a drive mechanism distance sensor.

31. The method of claim 30, wherein applying the closing force to the jaws comprises applying the closing force until the jaws reach a predetermined separation and then measuring the reaction force on the flexure.

* * * * *